United States Patent
Meiser et al.

(10) Patent No.: US 9,123,559 B2
(45) Date of Patent: Sep. 1, 2015

(54) METHOD FOR PRODUCING A SEMICONDUCTOR COMPONENT

(71) Applicant: Infineon Technologies AG, Neubiberg (DE)

(72) Inventors: Andreas Meiser, Sauerlach (DE); Markus Zundel, Egmeting (DE)

(73) Assignee: Infineon Technologies AG, Neubiberg (DE)

( * ) Notice: Subject to any disclaimer, the term of this patent is extended or adjusted under 35 U.S.C. 154(b) by 92 days.

(21) Appl. No.: 13/906,425

(22) Filed: May 31, 2013

(65) Prior Publication Data

US 2014/0357048 A1    Dec. 4, 2014

(51) Int. Cl.
| | |
|---|---|
| H01L 21/336 | (2006.01) |
| H01L 29/06 | (2006.01) |
| H01L 29/423 | (2006.01) |
| H01L 29/66 | (2006.01) |
| H01L 29/78 | (2006.01) |
| H01L 21/28 | (2006.01) |
| H01L 21/762 | (2006.01) |
| H01L 29/40 | (2006.01) |

(52) U.S. Cl.
CPC ...... *H01L 29/0696* (2013.01); *H01L 21/28008* (2013.01); *H01L 21/76224* (2013.01); *H01L 29/407* (2013.01); *H01L 29/42356* (2013.01); *H01L 29/66348* (2013.01); *H01L 29/66704* (2013.01); *H01L 29/7813* (2013.01)

(58) Field of Classification Search
USPC ........................... 438/270; 257/331, 330, 332
See application file for complete search history.

(56) References Cited

U.S. PATENT DOCUMENTS

| | | | |
|---|---|---|---|
| 5,945,708 A | 8/1999 | Tihanyi | |
| 6,284,604 B1 | 9/2001 | Tihanyi | |
| 8,519,473 B2 | 8/2013 | Meiser et al. | |
| 2012/0264259 A1* | 10/2012 | Hirler et al. | 438/123 |
| 2013/0075814 A1* | 3/2013 | Meiser et al. | 257/334 |
| 2013/0307062 A1 | 11/2013 | Meiser et al. | |

FOREIGN PATENT DOCUMENTS

| | | |
|---|---|---|
| DE | 19638438 A1 | 4/1998 |
| DE | 102006046869 A1 | 4/2008 |

* cited by examiner

*Primary Examiner* — Reema Patel
(74) *Attorney, Agent, or Firm* — Murphy, Bilak & Homiller, PLLC

(57) ABSTRACT

Methods for producing a semiconductor component that includes a transistor having a cell structure with a number of transistor cells monolithically integrated in a semiconductor body and electrically connected in parallel. In an example method, first trenches extending from the top side into the semiconductor body are produced, as are second trenches that each extend from the top side deeper into the semiconductor body than each of the first trenches. A first dielectric abutting on a first portion of the semiconductor body is produced at a surface of each of the first trenches. Also produced is a second dielectric at a surface of each of the second trenches. In each of the first trenches, a gate electrode is produced, after which a second portion of the semiconductor body is electrically insulated from the first portion of the semiconductor body by removing a bottom layer of the semiconductor body.

25 Claims, 24 Drawing Sheets

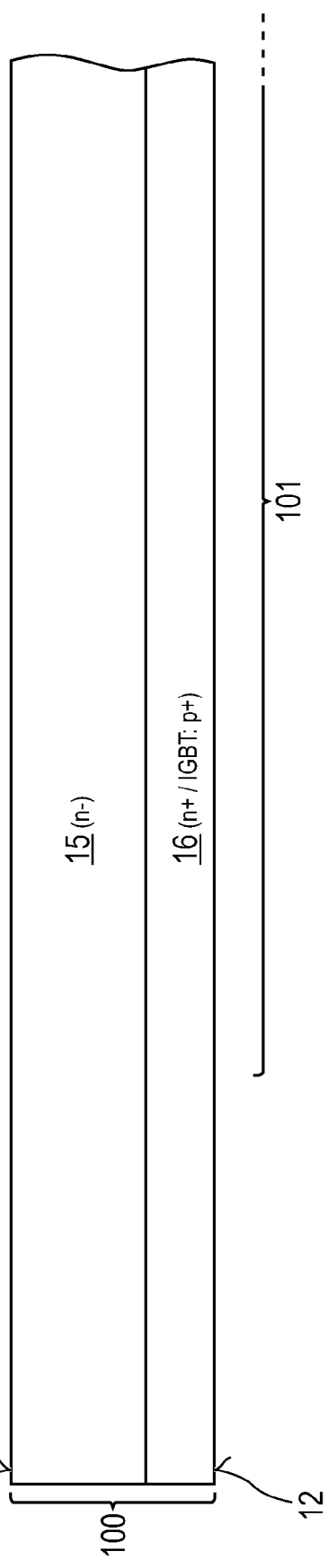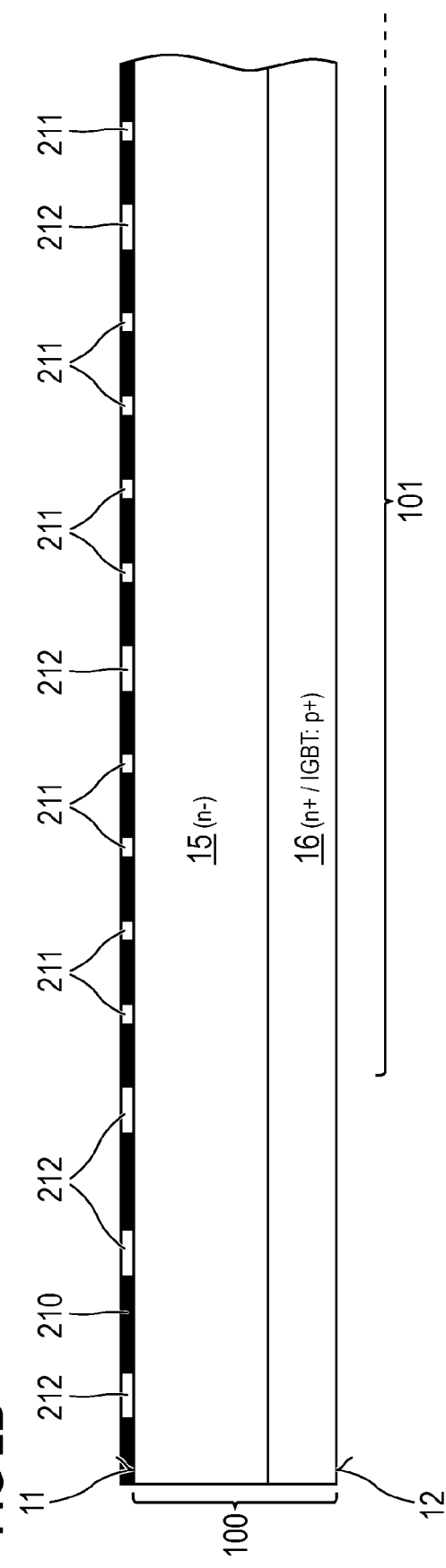

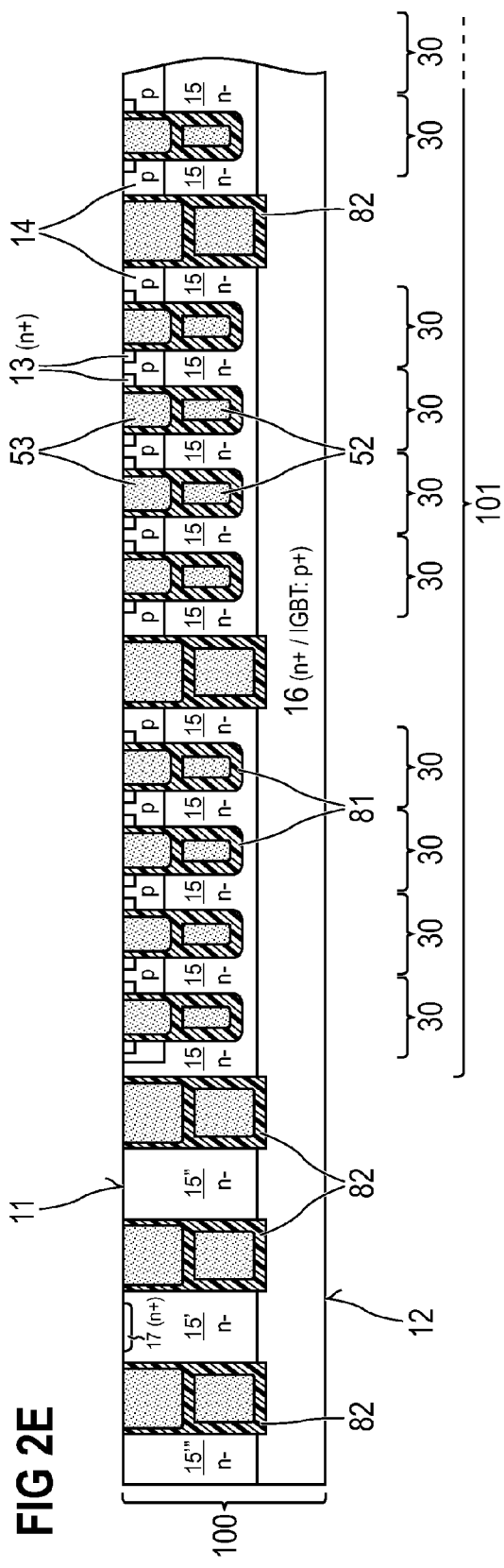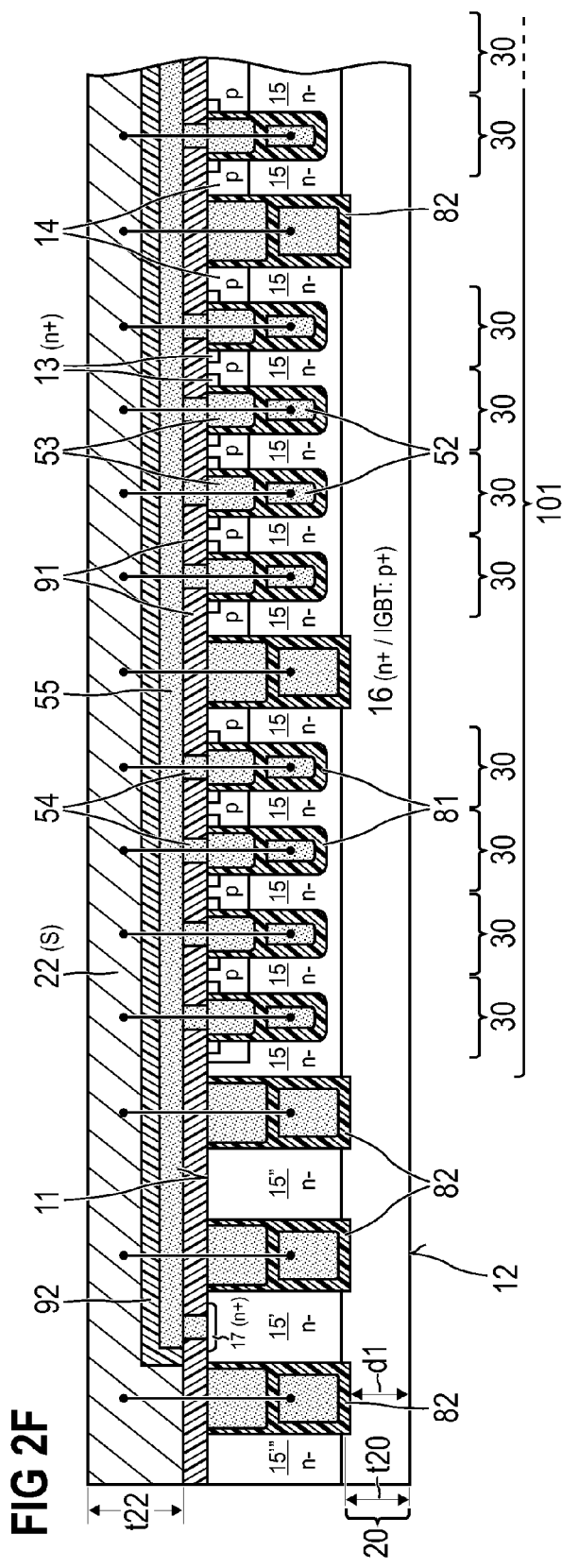

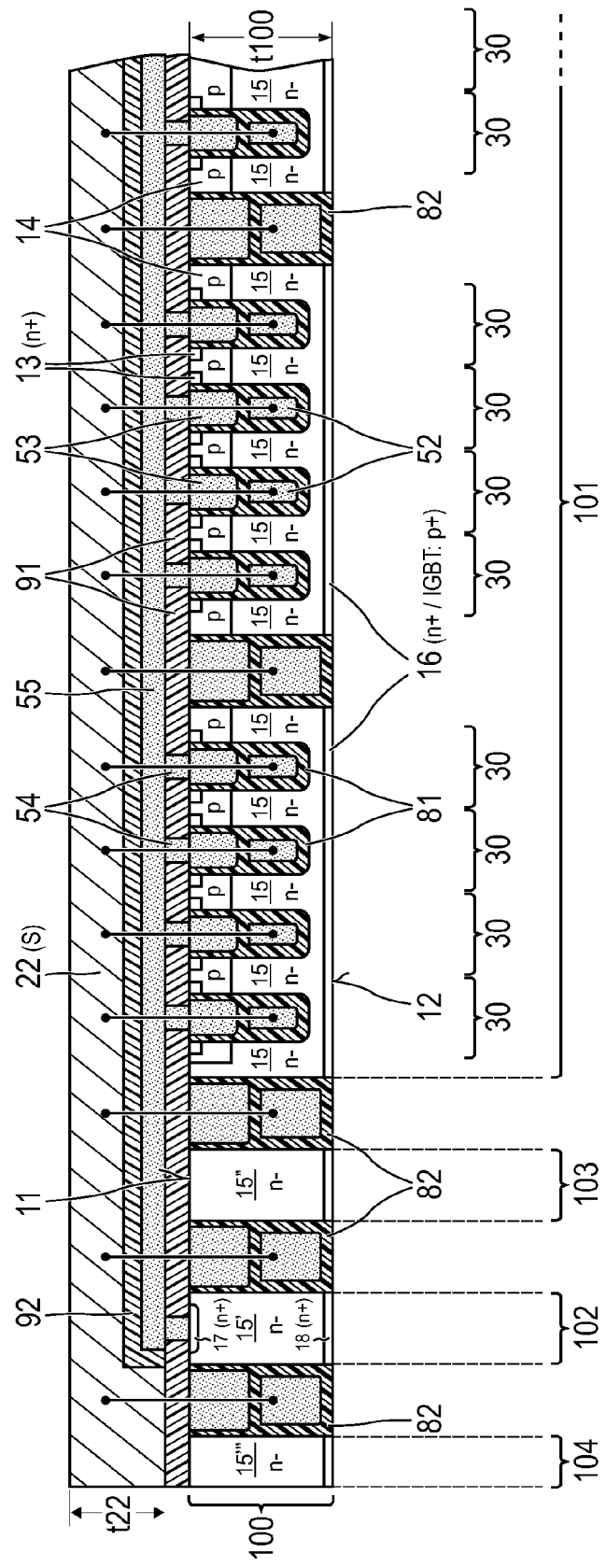

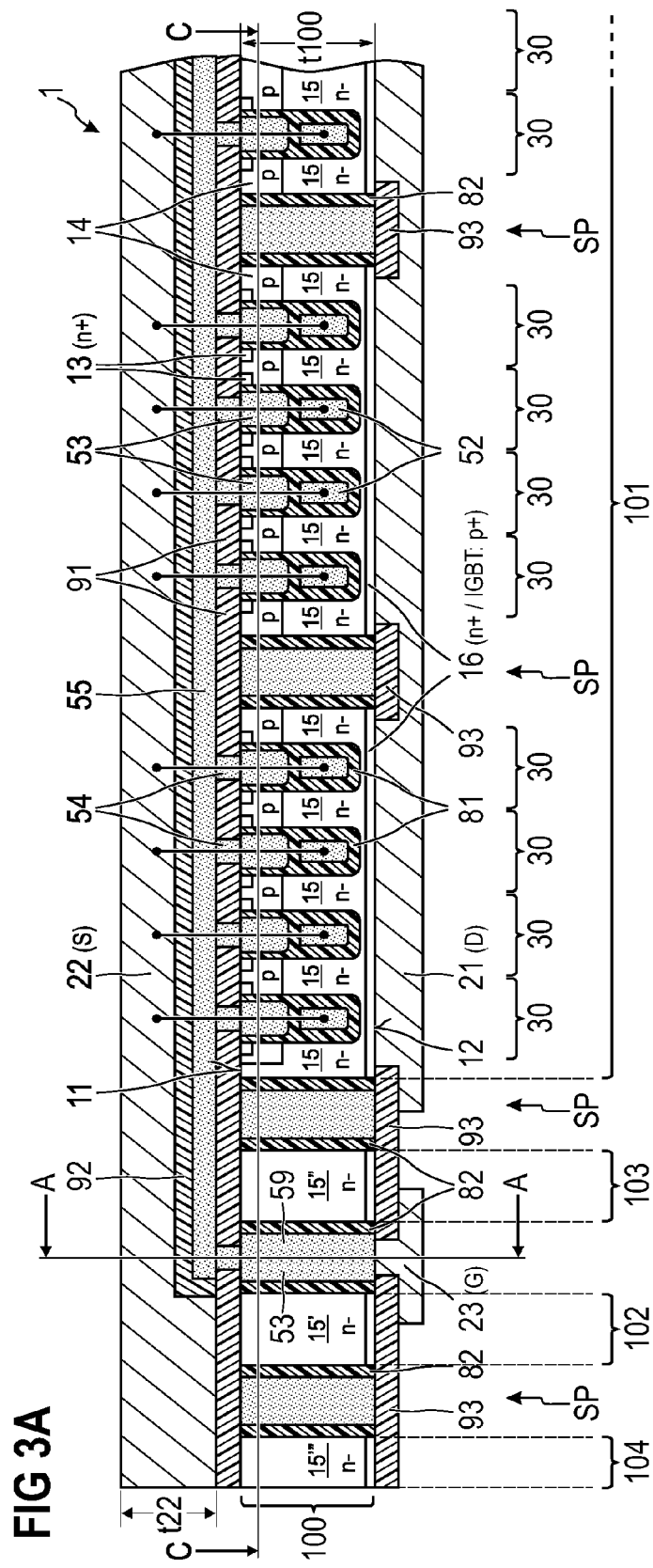

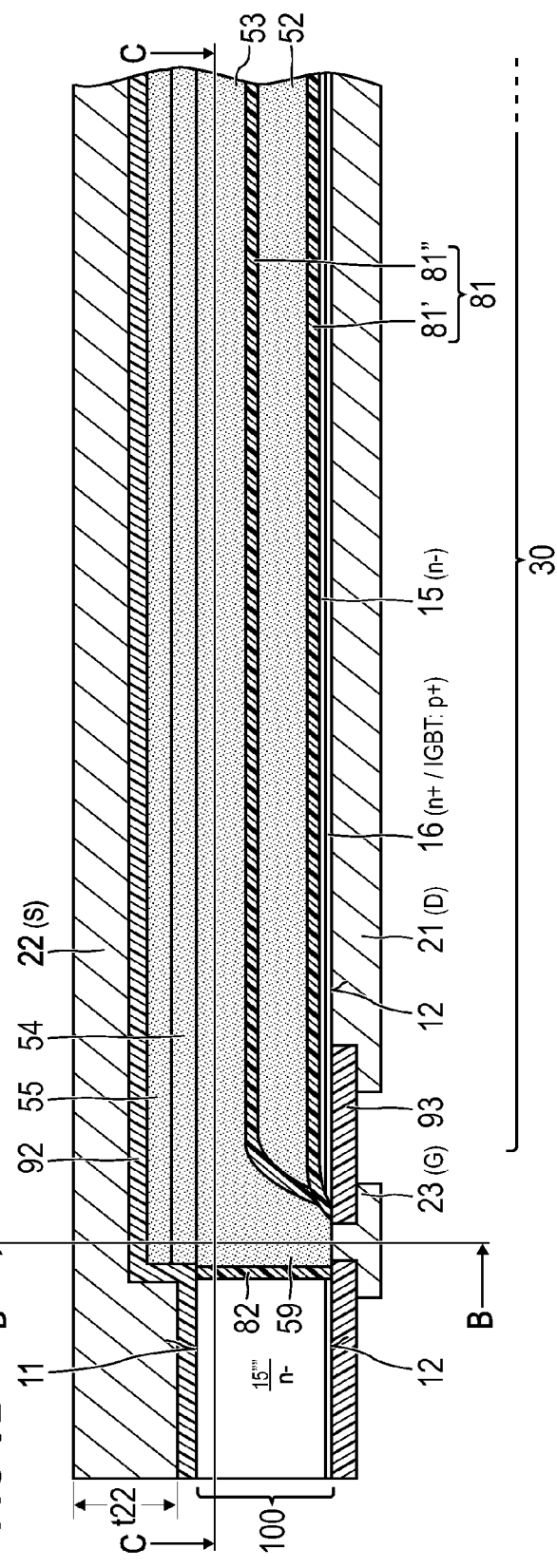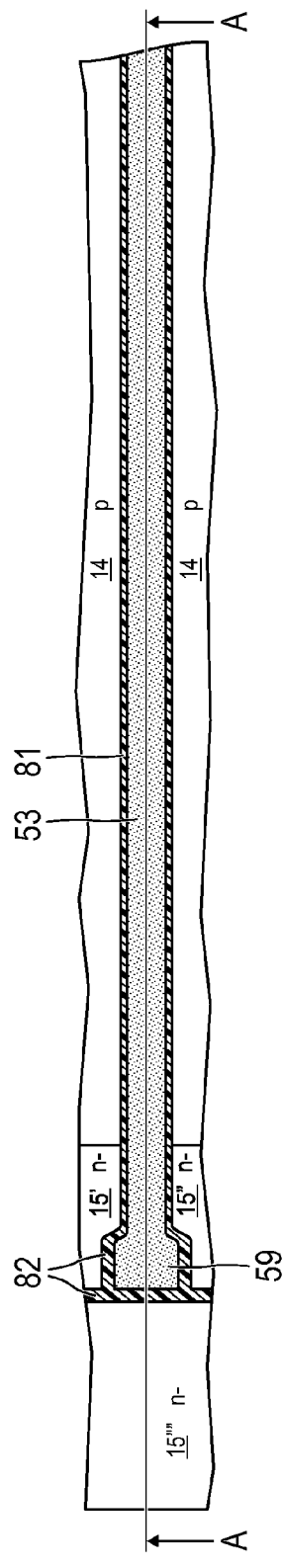

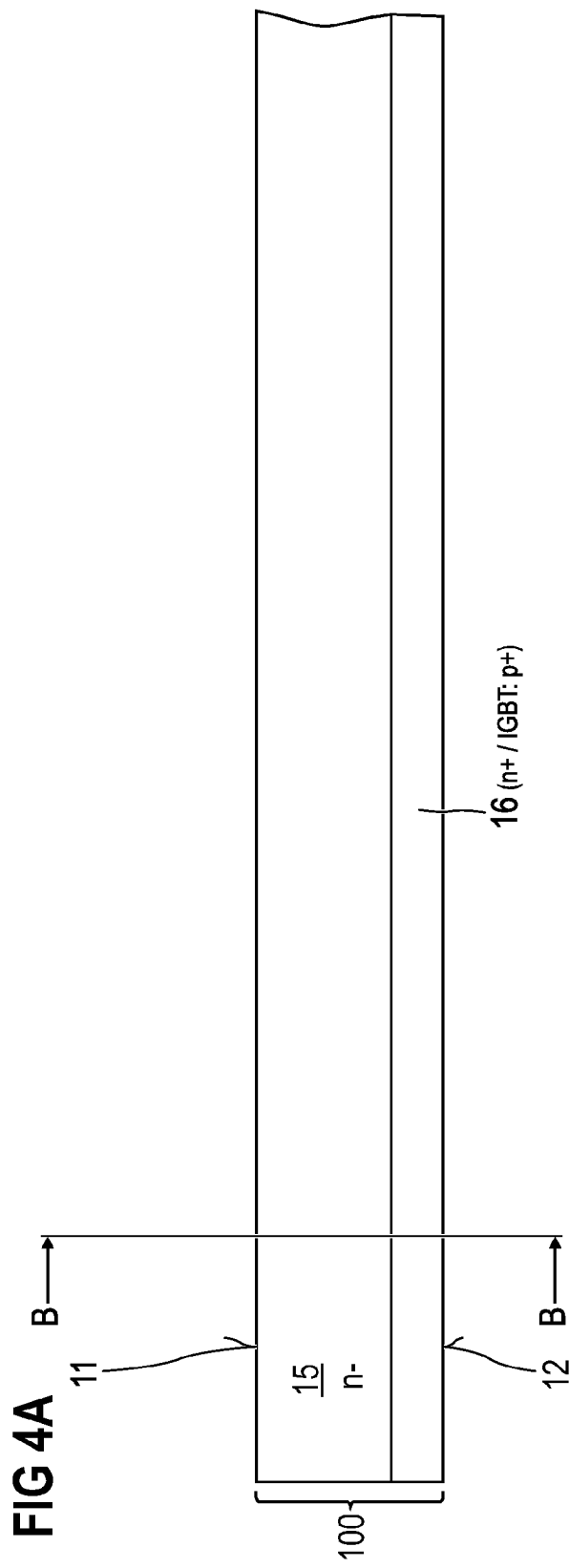

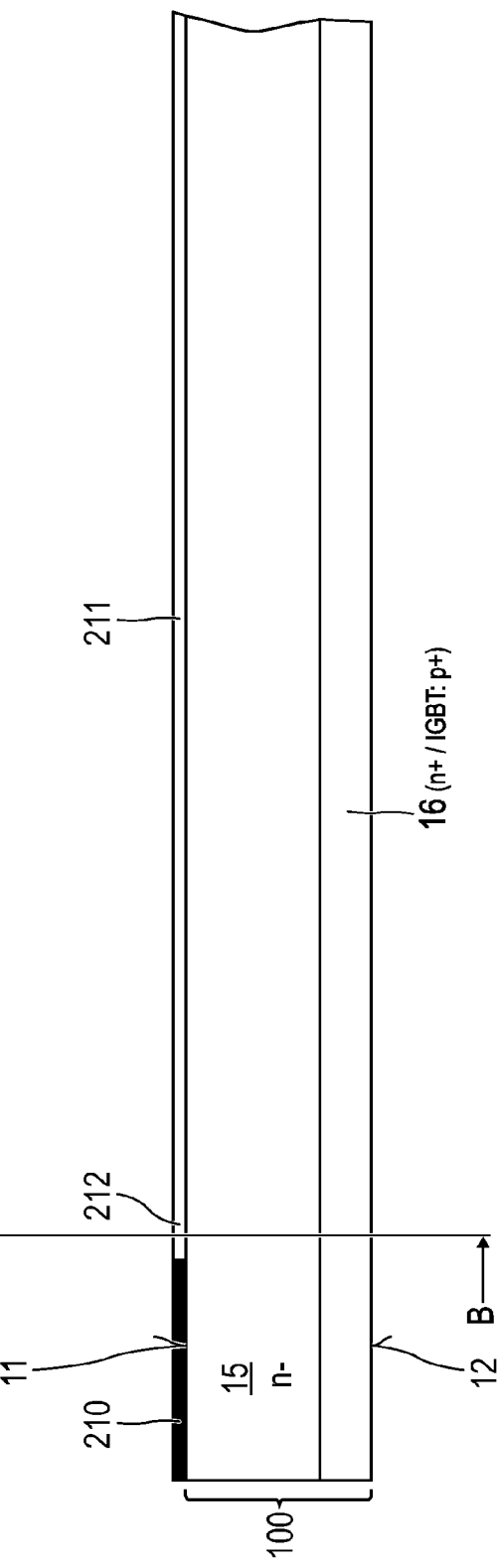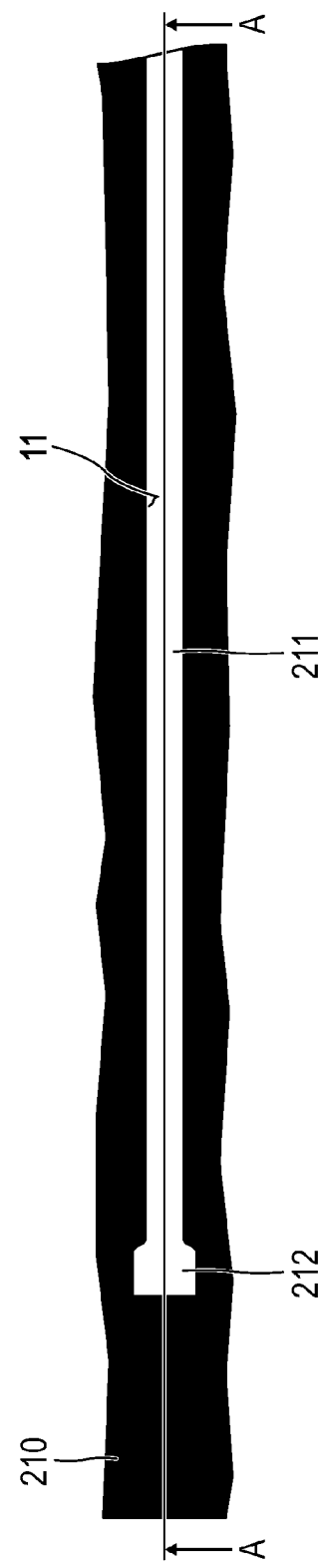

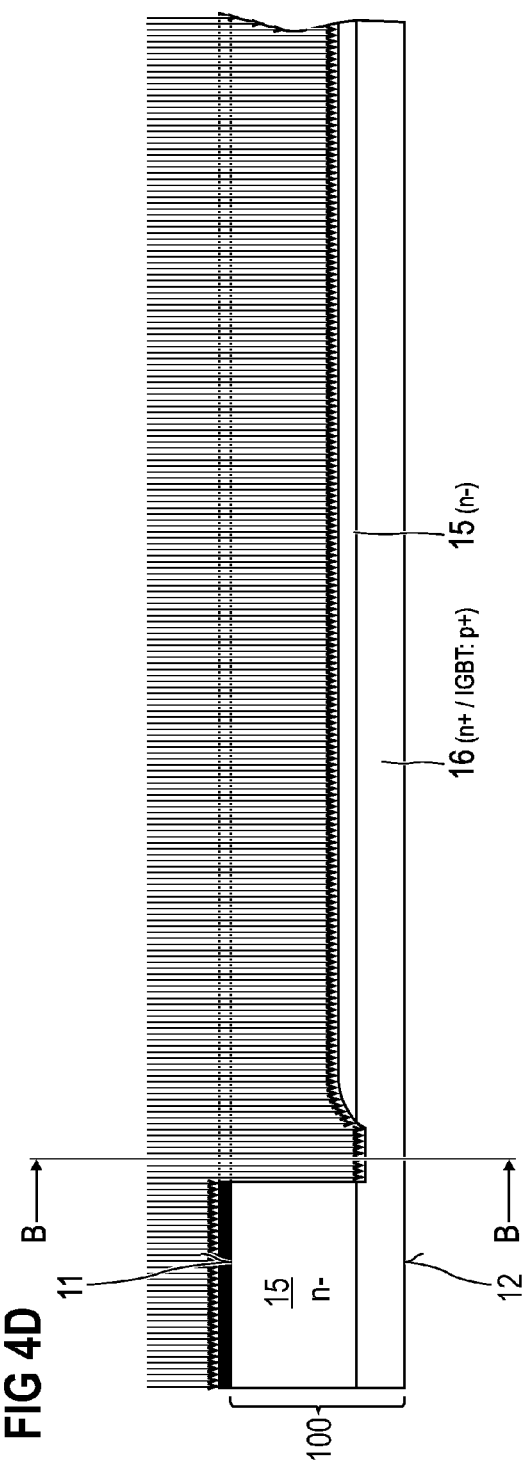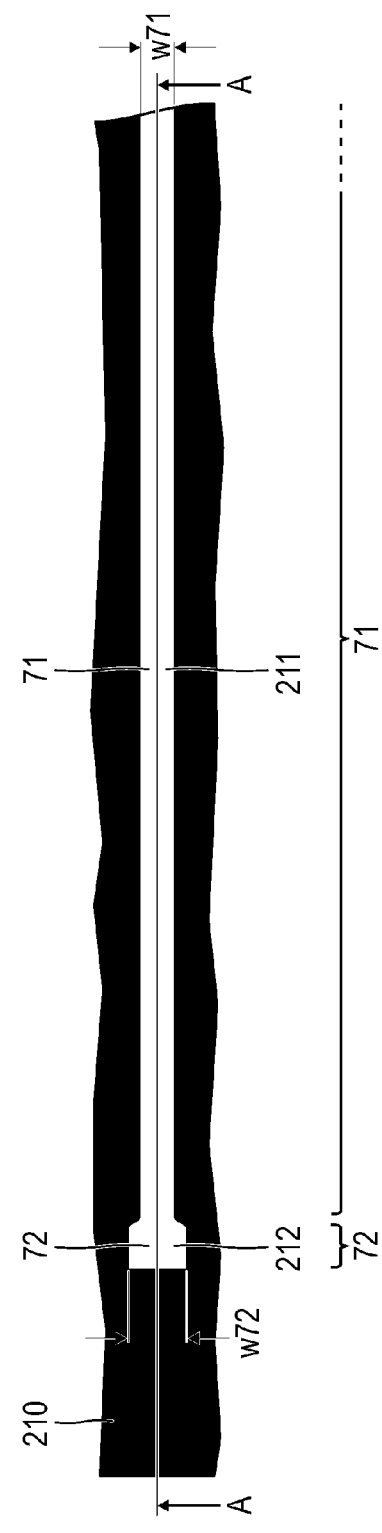

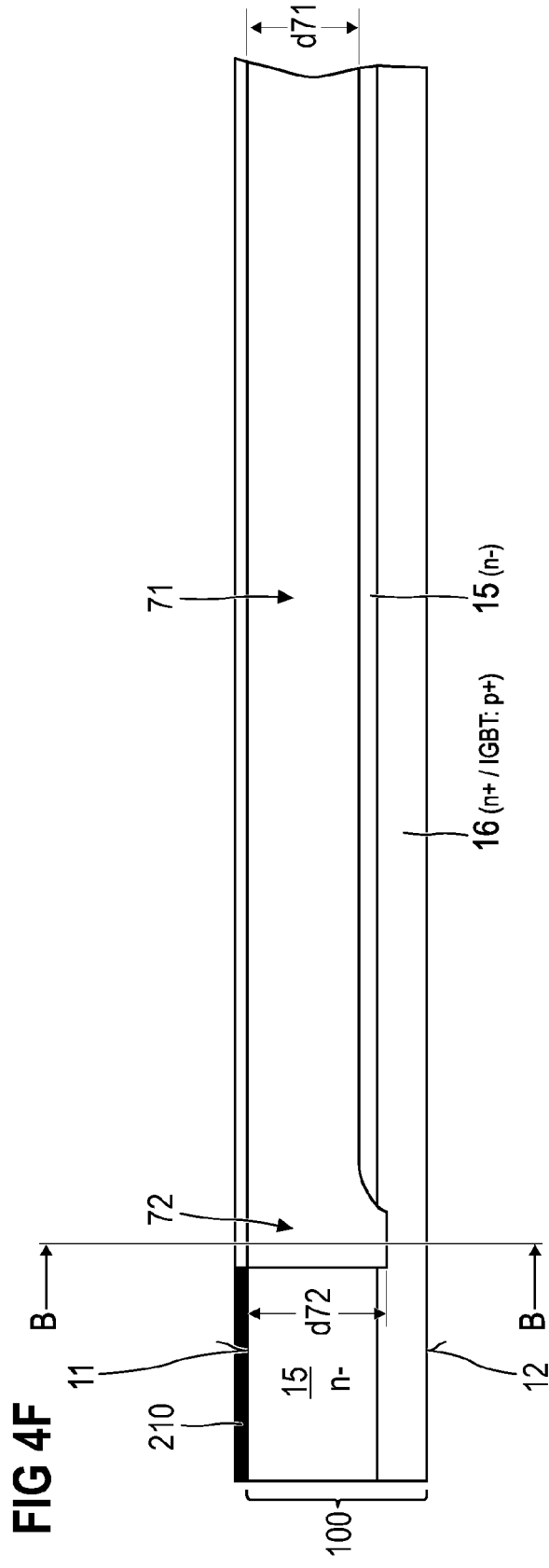

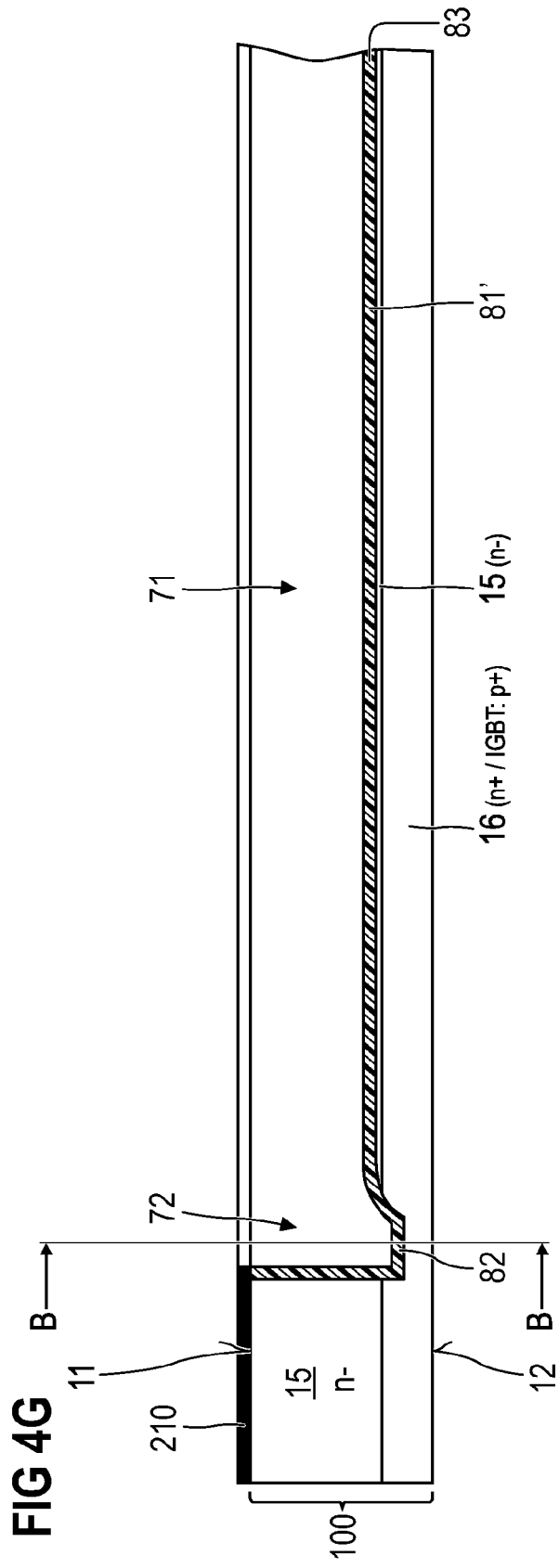

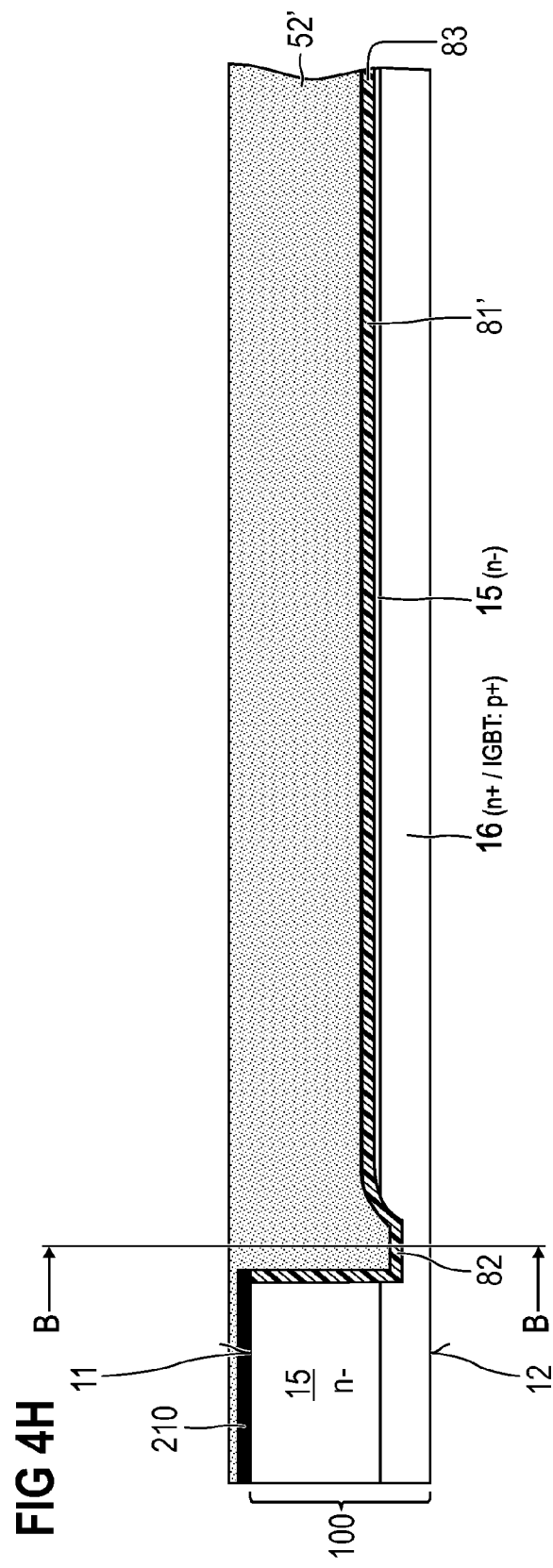

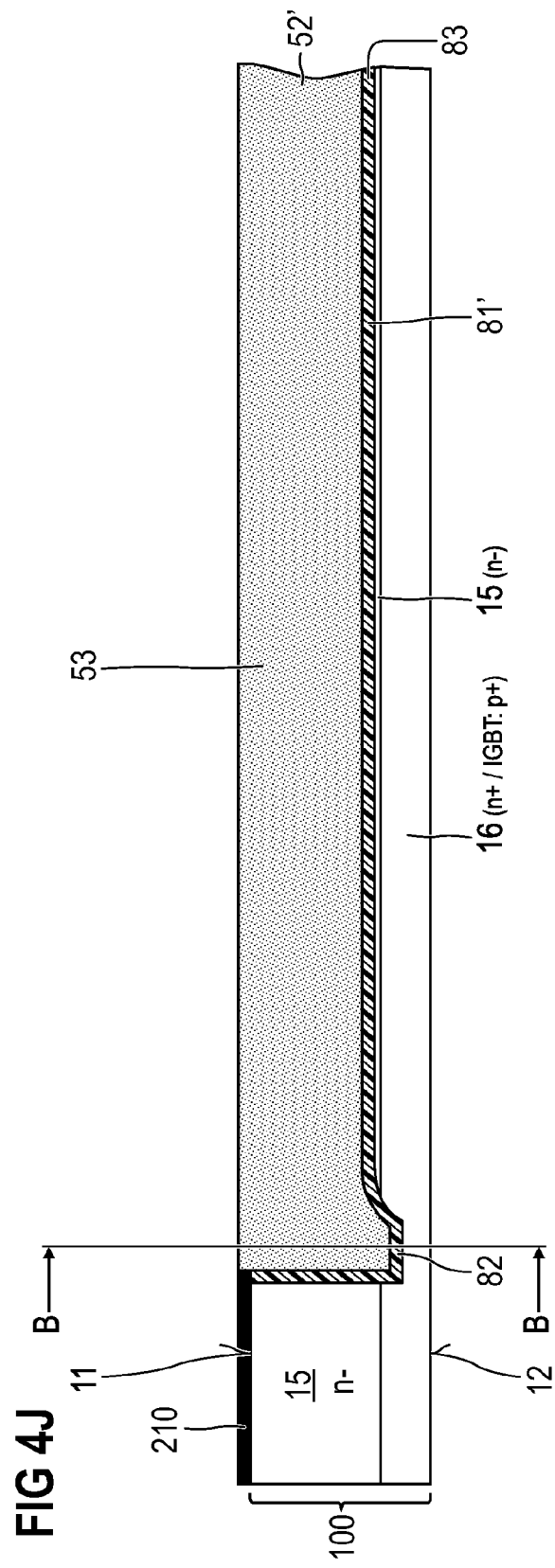

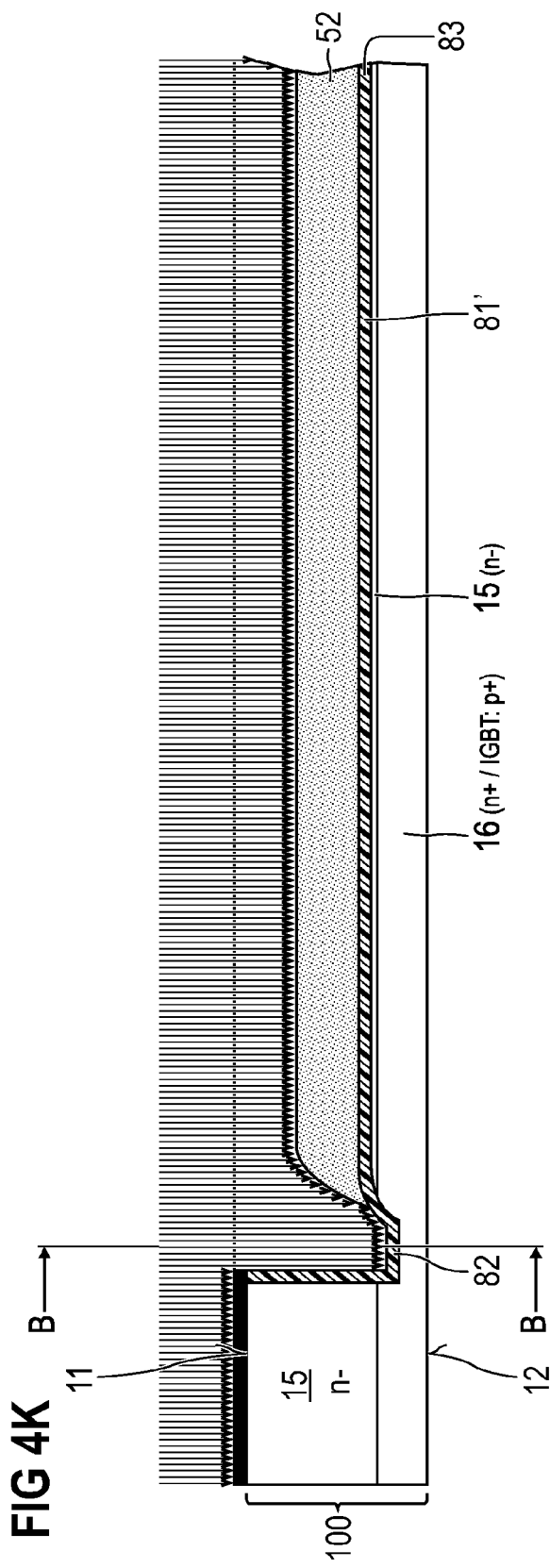

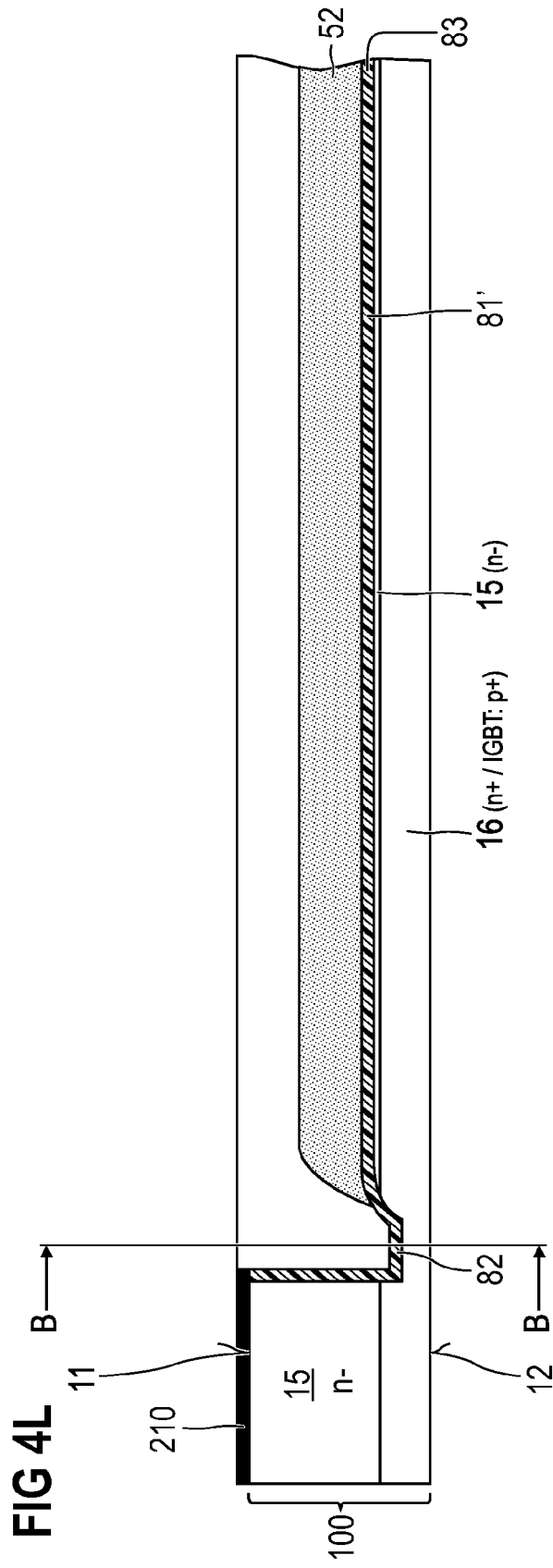

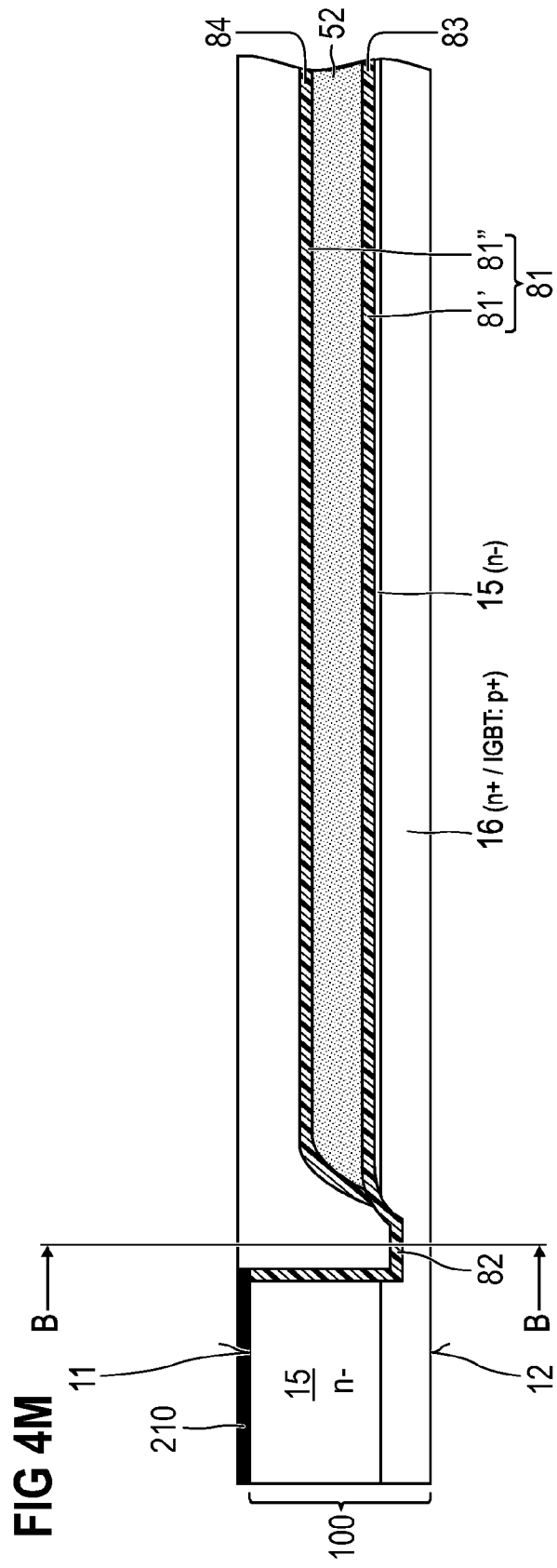

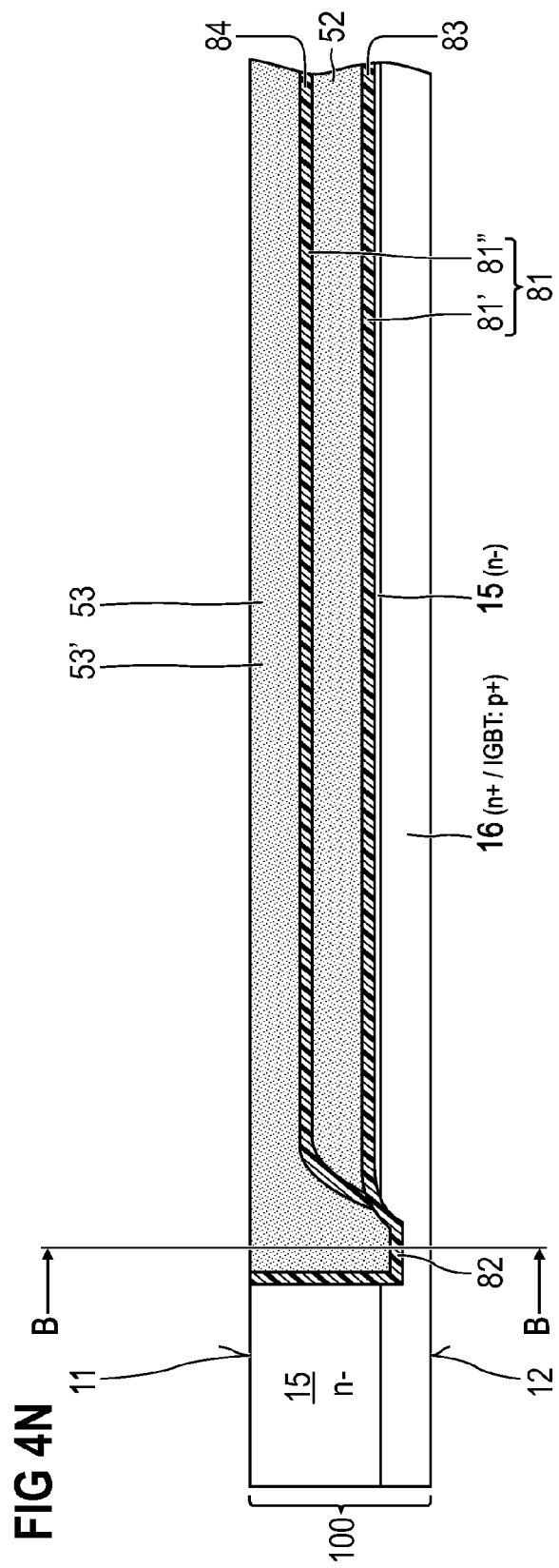

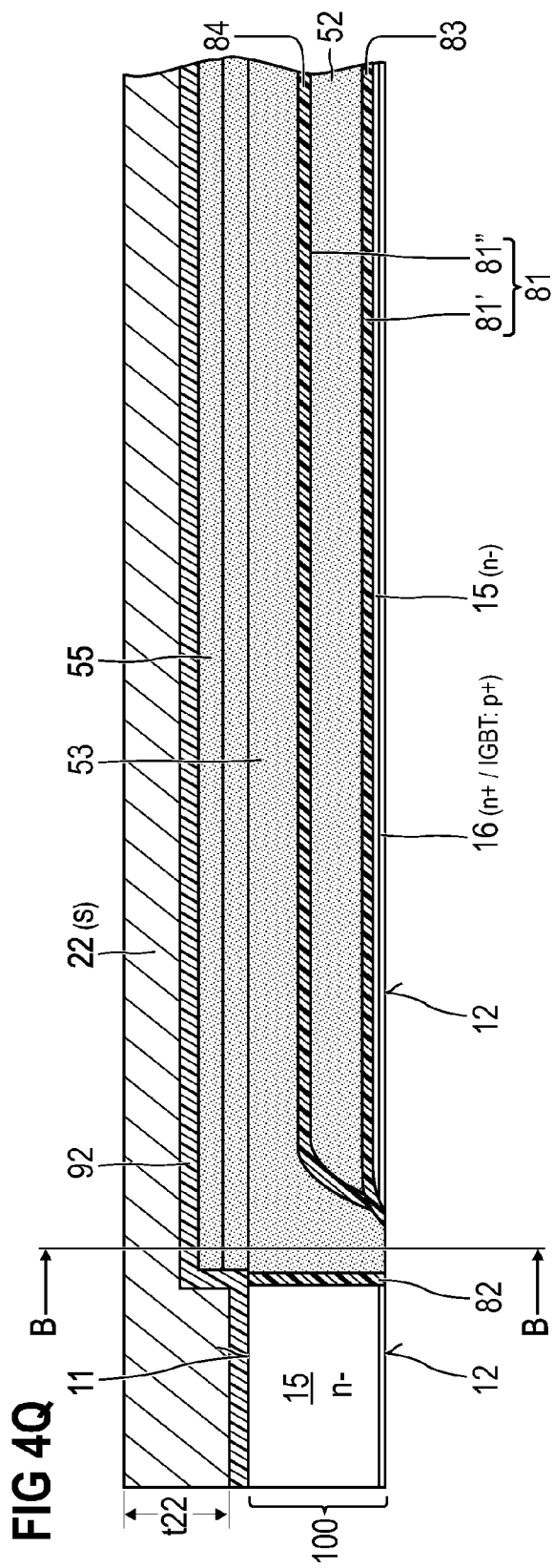

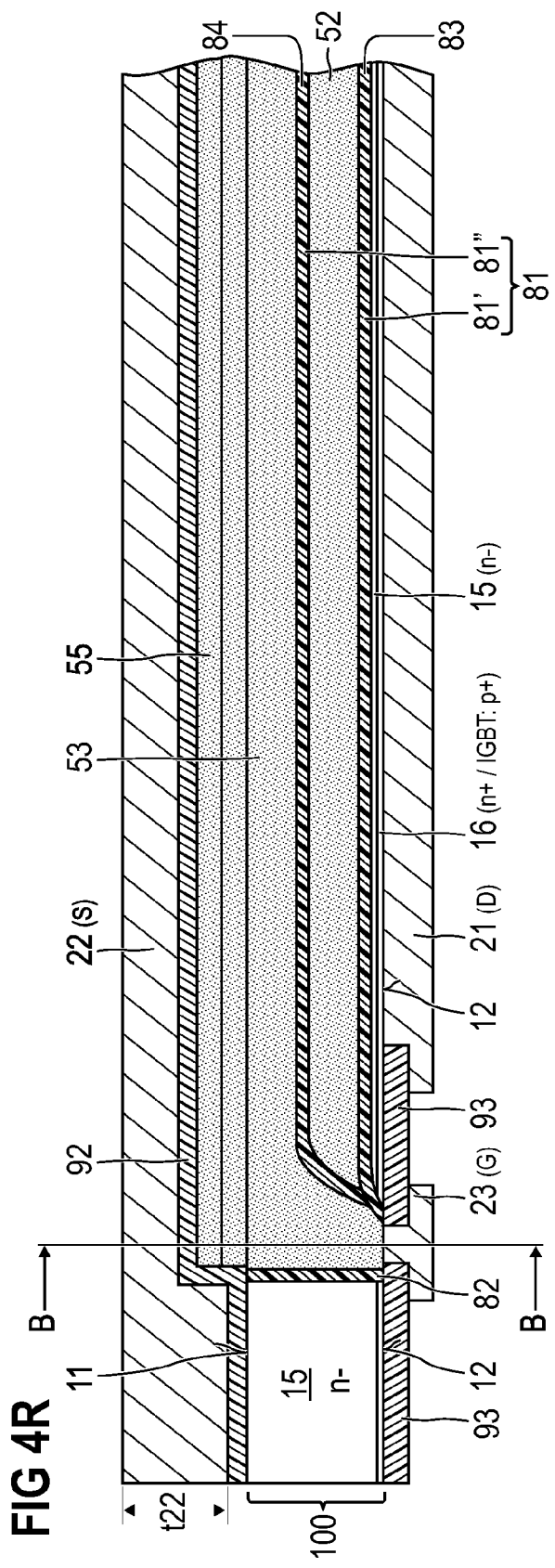

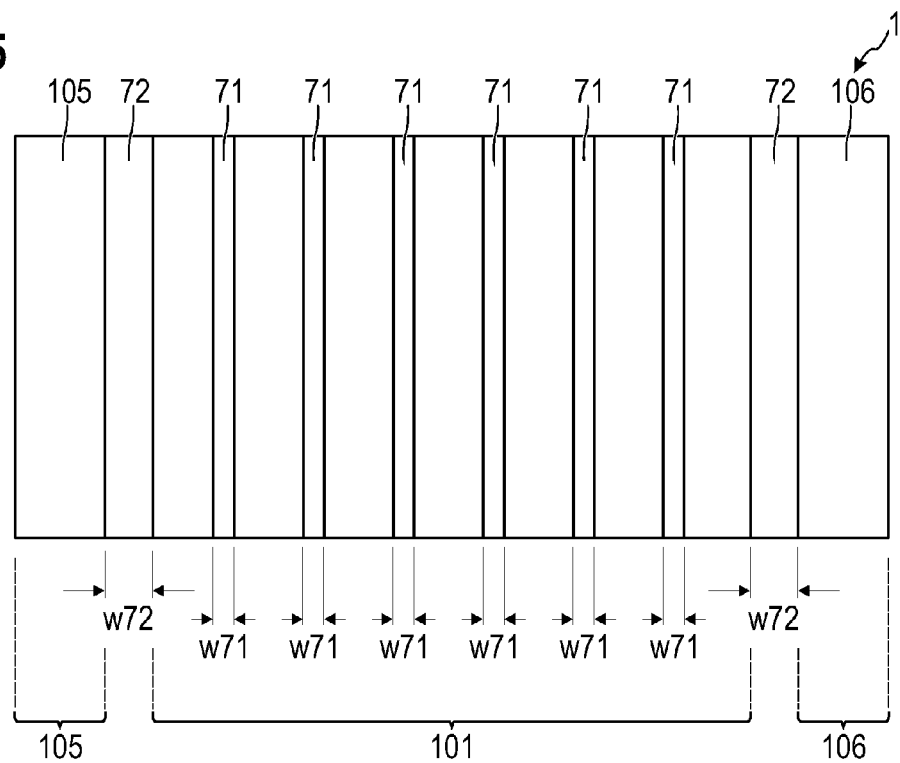
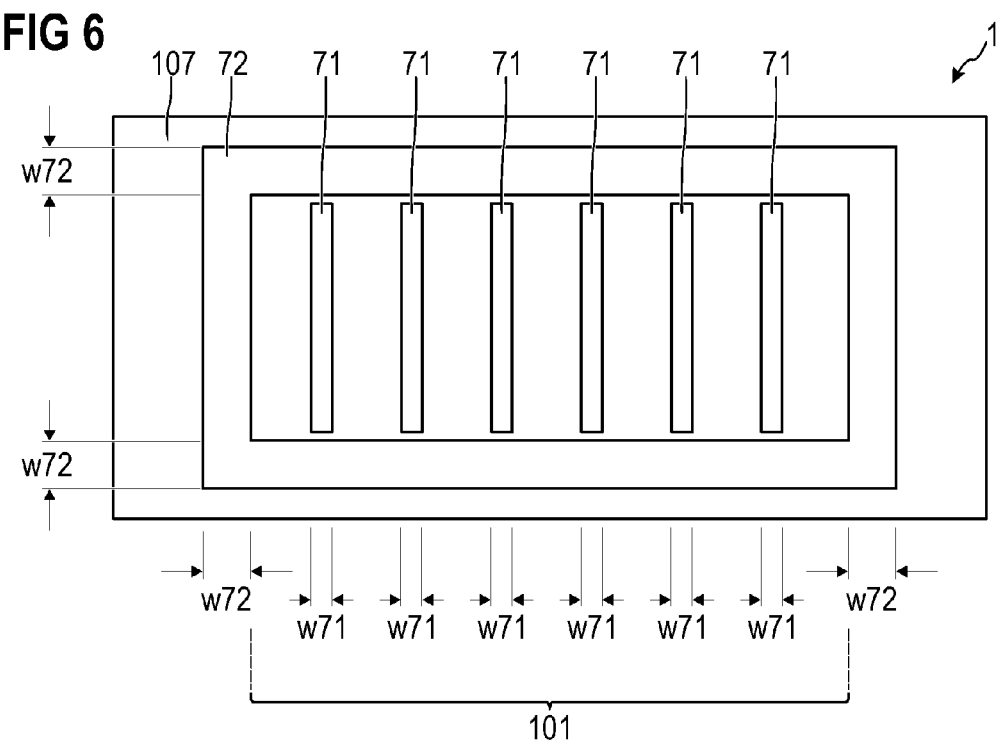

METHOD FOR PRODUCING A SEMICONDUCTOR COMPONENT

TECHNICAL FIELD

Embodiments of the present invention relate to a method for producing a semiconductor component.

BACKGROUND

Transistors, for instance IGFETs (Insulated Gate Field Effect Transistors) like MOSFETs (Metal Oxide Field Effect Transistors) or IGBTs (Insulated Gate Bipolar Transistors), are produced from a semiconductor body. For many of these transistors it is desirable to electrically connect structures arranged at or on opposite sides of the semiconductor body.

For instance, n-channel MOSFETs have a semiconductor body with a source region and a drain region, a gate electrode, a source contact terminal, a drain contact terminal and a gate contact terminal. In this regard it is to be noted that in the sense of the present application, a "contact terminal" is a terminal that allows for electrically contacting the completed semiconductor component. That is, a "contact terminal" is accessible from outside the completed semiconductor component. Further, a "gate electrode" is regarded as an electrode that directly abuts on the gate dielectric. The source contact terminal is electrically connected to the source region, the drain contact terminal is electrically connected to the drain region, and the gate contact terminal is electrically connected to the gate electrode. Due to the construction of a vertical MOSFET, the gate electrode and the source region are arranged at the same side of the semiconductor body, whereas the drain region is arranged at an opposite side of the semiconductor body.

Since the waste-heat producing pn-junction of the MOSFET is located closer to the source region than to the drain region, it is advantageous to cool the MOSFET from that side of the semiconductor body at which the source region is located. However, in such a concept for cooling the semiconductor component, electrically connecting the gate contact terminal is difficult if the gate contact terminal is arranged at the same side of the semiconductor body as the source region. Therefore, it is desirable to arrange the gate contact terminal at that side of the semiconductor body that is opposite to the side at which the source region is arranged. However, since the gate electrode is arranged at the same side of the semiconductor body as the source region, an electrical connection between the gate electrode and the gate contact terminal, that is, an electrical connection between structures arranged at or on opposite sides of the semiconductor body is required.

Since in general the production of electrical connections between structures arranged at or on opposite sides of a semiconductor body is complicated and expensive, there is a need for a simple method for the production of a semiconductor component having an electrical connection line connecting structures arranged at or on opposite sides of a semiconductor body of the semiconductor component.

SUMMARY

One aspect of the invention relates to methods for producing a semiconductor component that includes a transistor having a cell structure with a number of transistor cells monolithically integrated in a semiconductor body and electrically connected in parallel. In an example of those methods, a semiconductor body with a top side and with a bottom side opposite the top side is provided. A plurality of first trenches that extend from the top side into the semiconductor body is produced. Also produced is a plurality of second trenches, each extending from the top side into the semiconductor body deeper than each of the first trenches. Subsequently, a first dielectric abutting on a first portion of the semiconductor body is produced at a surface of each of the first trenches. Also produced is a second dielectric at a surface of each of the second trenches. In each of the first trenches, a gate electrode is produced. After the production of the gate electrodes, a second portion of the semiconductor body is electrically insulated from the first portion of the semiconductor body, by removing a bottom layer of the semiconductor body.

BRIEF DESCRIPTION OF THE DRAWINGS

Examples will now be explained with reference to the drawings. The drawings are not to scale. In the drawings, the same reference characters denote like features.

FIGS. 2A to 2G illustrate several steps during the production of the semiconductor component of FIG. 1.

FIG. 3A is a vertical cross-sectional view of a section of a further semiconductor component having a connection line electrically connecting structures arranged at or on opposite sides of a semiconductor body of the semiconductor component.

FIG. 3B is a further vertical cross-sectional view of the semiconductor component of FIG. 3A.

FIG. 3C is a horizontal cross-sectional view of the semiconductor component of FIGS. 3A and 3B.

FIGS. 4A to 4H, 4J to 4N, and 4P to 4R illustrate several steps during the production of the semiconductor component of FIGS. 3A and 3B.

FIGS. 5 to 7 illustrate further examples of semiconductor components in which portions of a semiconductor body are separated and electrically insulated from one another by wide trenches.

DETAILED DESCRIPTION

In the following detailed description, reference is made to the accompanying drawings, which form a part thereof, and in which are shown by way of illustration specific embodiments in which the invention may be practiced. In this regard, directional terminology, such as "top", "bottom", "front", "back", "leading", "trailing" etc., is used with reference to the orientation of the Figures being described. Because components of embodiments can be positioned in a number of different orientations, the directional terminology is used for purposes of illustration and is in no way limiting. It is to be understood that other embodiments may be utilized and that structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
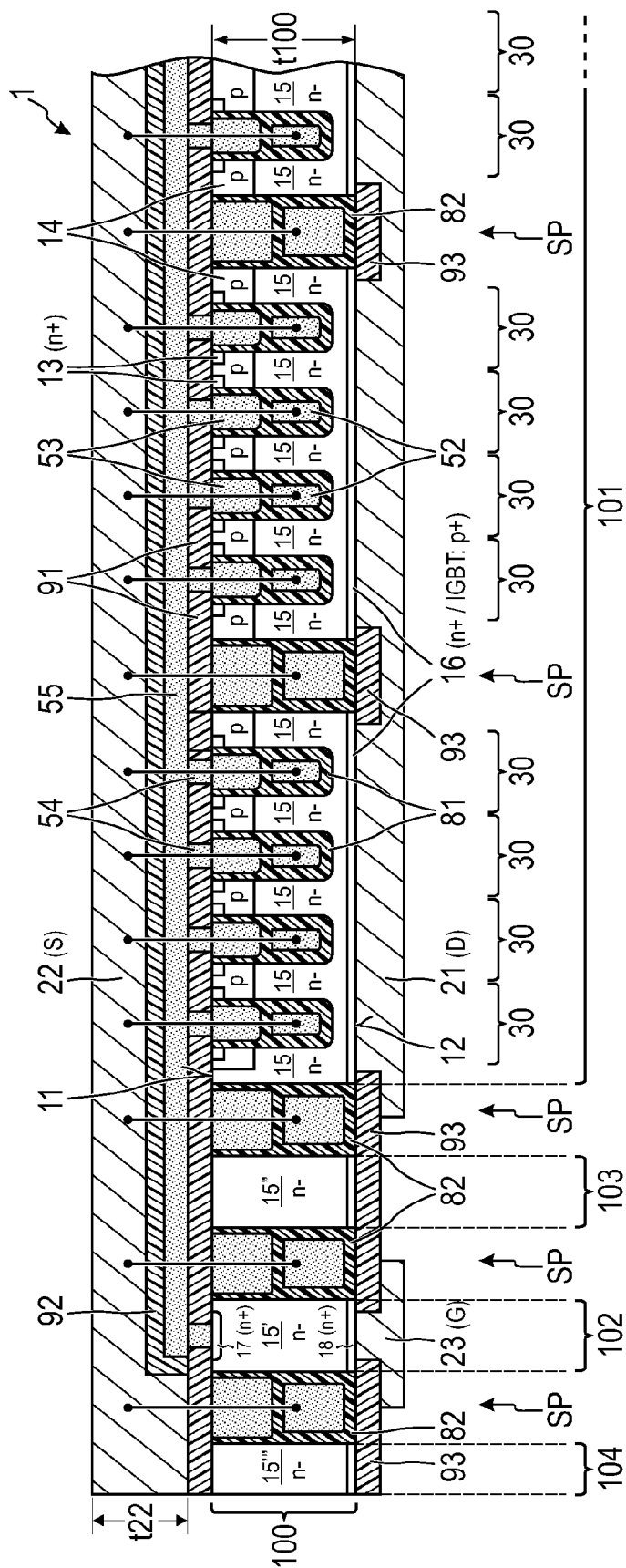
FIG. 1 is a vertical cross-sectional view of a section of a semiconductor component having a connection line electrically connecting structures arranged at or on opposite sides of a semiconductor body of the semiconductor component.

FIG. 1 is a cross-sectional view of a semiconductor component 1 having a semiconductor body 100. The semiconductor body 100 includes an arbitrary semiconductor material such as silicon (Si), silicon carbide (SiC), gallium arsenide (GaAs), gallium phosphide (GaP), or any other IV-IV, III-V or II-VI semiconductor material. In the ideal case, the semiconductor body 100 has a monocrystalline structure. However, the semiconductor body 100 may also have a small number of crystallographic defects like point defects, line defects, planar defects, or bulk defects. In contrast, a body formed of polycrystalline semiconductor material, e.g. polycrystalline silicon, has a large number of crystallographic defects.

In order to realize an electronic structure monolithically integrated in the semiconductor body 100 and having an arbitrary functionality, the semiconductor body 100 may have any combination of doped and/or undoped crystalline semiconductor material, doped and/or undoped polycrystalline semiconductor material, p-conductive semiconductor regions, n-conductive semiconductor regions, trenches, metallization layers, dielectric layers, semiconductor resistance regions, pn-junctions and so on.

For instance, the electronic structure may consist of or include a transistor, e.g., a bipolar or a unipolar transistor like an IGFET (Insulated Gate Field Effect Transistor), e.g., a MOSFET (Metal Oxide Field Effect Transistor), an IGBT (Insulated Gate Bipolar Transistor), a JFET (Junction Field Effect Transistor), a thyristor, a diode, a resistor, or any other electronic structure.

The semiconductor body 100 has a bottom side 12 and a top side 11 spaced distant from the bottom side 12. The top side 11 and the bottom side 12 form opposite sides of the semiconductor body 100. Between the top side 11 and the bottom side 12, the semiconductor body 100 has a maximum thickness t100. The maximum thickness t100 may be, for instance, less than 20 μm.

A first contact terminal 21 and a gate contact terminal 23 are arranged, electrically insulated from one another, on the bottom side 12, and a second contact terminal 22 is arranged on the top side 11. A load path is formed between the first contact terminal 21 and the second contact terminal 22. During the operation of the semiconductor component 1, an electric current between the first contact terminal 21 and the second contact terminal 22, i.e. an electric current through the load path, may be controlled via the gate contact terminal 23.

The contact terminals 21, 22, 23 serve to electrically connect the semiconductor component 1 to external devices and/or circuits like a circuit board, a power supply, a load, etc. The contact terminals 21, 22, 23 may consist of or include metal, e.g., aluminum, copper, tungsten, titanium, molybdenum, alloys with at least one of those metals, and/or may consist of or include doped polycrystalline semiconductor material like polycrystalline silicon, etc.

Further, for instance in case of a MOS transistor, the first contact terminal 21 may be a source contact terminal and the second contact terminal 22 may be a drain contact terminal, or the first contact terminal 21 may be a drain contact terminal and the second contact terminal 22 may be a source contact terminal, or the first contact terminal 21 may be an emitter contact terminal and the second contact terminal 22 may be a collector contact terminal, or the first contact terminal 21 may be a collector contact terminal and the second contact terminal 22 may be an emitter contact terminal.

In the illustrated embodiment, the electronic structure is a vertical power transistor having a plurality of transistor cells 30 monolithically integrated in the semiconductor body 100. For instance, the individual transistor cells 30 may be realized as strip cells running parallel to one another as is known in the art. However, the individual transistor cells 30 may also have any other cell structure like rectangular, square, hexagonal or arbitrarily polygonal, as is also known in the art.

A drift zone 15 of a first conduction type (here: 'n'), body zones 14 of a second conduction type (here: 'p') having a conduction type complementary to the first conduction type, and heavily doped source zones 13 of the first conduction type (here: 'n') are formed in the semiconductor body 100. Thereby, each of the transistor cells 30 includes at least one of the body zones 14 and one of the source zones 13.

The body zones 14, which are arranged between the drift zone 15 and the top side 11, contact the second contact terminal 22, which here is a source contact terminal 22 and therefore additionally designated with "S". Further, a drain zone 16 formed in the semiconductor body 100 is arranged between the bottom side 12 and the drift zone 15 and may optionally directly abut on the drift zone 15. The drain zone 16 contacts the first contact terminal 21 which here is a drain contact terminal 21 and therefore additionally designated with "D".

The drain zone 16 is of the first conduction type (here: 'n') if the power transistor is an unipolar IGFET or of the second conduction type (here: 'p') if the power transistor is an IGBT. In both cases, the drain zone 16 has a dopant concentration that is higher than a dopant concentration of the drift zone 15. In the sense of the present invention, 'dopant concentration' relates to the concentration of electrically active dopants, that is, to dopants causing either an n-conductivity or a p-conductivity if being introduced into the semiconductor body 100.

A doping concentration of the drift zone 15 lies for example in the range of $10^{15}$ cm$^{-3}$ to $10^{17}$ cm$^{-3}$ (1E15 cm$^{-3}$ to 1E17 cm$^{-3}$), a doping concentration of the source zone 13 in the range of $10^{19}$ cm$^{-3}$ to $10^{20}$ cm$^{-3}$ (1E19 cm$^{-3}$ to 1E20 cm$^{-3}$) and a doping concentration of the drain zone 16 in the range of $5*10^{17}$ cm$^{-3}$ to $10^{21}$ cm$^{-3}$ (5E17 cm$^{-3}$ to 1E21 cm$^{-3}$) for a MOSFET and for example in the range of $10^{17}$ cm$^{-3}$ to $10^{19}$ cm$^{-3}$ (1E17 cm$^{-3}$ to 1E19 cm$^{-3}$) for an IGBT.

For controlling an electric current between the first contact terminal 21 and the second contact terminal 22, each of the transistor cells 30 has an electrically conductive gate electrode 53, e.g., consisting of or including a doped polycrystalline semiconductor material like polycrystalline silicon, or consisting of or including a metal. A dielectric first trench isolation layer 81 that includes the gate dielectric, e.g., a semiconductor oxide, is arranged between each of the gate electrodes 53 on the one hand and the drift zone 15 and the body zone 14 on the other hand, in order to dielectrically insulate the gate electrodes 53 from the drift zone 15 and the body zone 14. Each of the gate electrodes 53 is arranged in a trench formed in the semiconductor body 100.

Optionally, the transistor may have, underneath each of the gate electrodes 53, that is, between the respective gate electrode 53 and the bottom side 12, a field electrode 52 that is electrically connected to the second contact terminal 22. In FIG. 1, the respective electrical connections are illustrated only schematically as they may be produced in any conventional manner known in the art.

In order to electrically connect the transistor cells 30 in parallel, the gate electrodes 53 are electrically interconnected by a gate connection line 55 that is electrically insulated from a first portion 101 of the semiconductor body 100. Optionally, one, more than one or all of the drain zone 16, the drift zone 15, the body zones 14, and the source zones 13 may form or be part of the first portion 101 of the semiconductor body 100.

The gate connection line 55 is electrically conductive and may, for instance, consist of or comprise polycrystalline semiconductor material, e.g. polycrystalline silicon, that is doped with electrically active dopants, or undoped. The gate connection line 55 may, for instance, also consist of or comprise a metal like aluminum, copper, etc. Also, a gate connection line 55 may consist of or include a salizide of a doped semiconductor material, e.g., TiSi, WSi, etc. A structured first dielectric layer 91 is arranged between the gate connection line 55 and the top side 11 in order to electrically insulate the gate connection line 55 from the drift zone 15, the body zones 14 and the source zones 13. Vias 54, which may be parts of the gate connection line 55 or which may be separate from the gate connection line 55, extend through the first dielectric layer 91 in order to electrically contact the gate electrodes 53. In any case, the vias 54 serve to electrically connect the gate electrodes 53 to the gate connection line 55.

Further, a second dielectric layer 92 is arranged between the gate connection line 55 and the second contact terminal 22 in order to electrically insulate the gate connection line 55 from the second contact terminal 22, and a third dielectric layer 93 is arranged on the bottom side 12 between in order to protect the areas of the bottom side 12 that are not covered with one of the electrodes 21, 23.

Then, a dielectric second trench isolation layer 82 electrically insulates a second portion 102 of the semiconductor body 100 from the first portion 101. Optionally, each of the first portion 101 and the second portion 102 of the semiconductor body 100 may extend continuously between the top side 11 and the bottom side 12. Also optionally, the semiconductor body 100 may have additional portions 103, 104 which are electrically insulated from both the first portion 101 and the second portion 102. As exemplarily illustrated in FIG. 1, such an additional portion 103 may be arranged between the first portion 101 and the second portion 102. In principle, the first, second and optional further portions 101, 102, 103, 104 of the semiconductor body 100 may have arbitrary structures and functions. In the illustrated embodiment, each of the portions 102, 103, 104 has a semiconductor region 15', 15" and 15''', respectively, which are remainders emanating from the production of the drift zone 15.

The second portion 102 is used as an electrical connection between structures arranged at or on opposite sides 11, 12 of the semiconductor body 100. In the illustrated embodiment, the second portion 102 electrically connects the gate connection line 55 arranged on the top side 11 with the gate contact terminal 23 arranged on the bottom side 12. In order to improve the electrical contacts between the second portion 102 on the one hand and the gate connection line 55 and the gate contact terminal 23 on the other hand, the second portion 102 may optionally have highly doped contact doping regions 17 and/or 18. The contact doping region 17 directly abuts on that one of the vias 54 that extends above the second portion 102 through the first dielectric layer 91. The contact doping region 18 directly abuts on the gate contact terminal 23.

As becomes clear from the illustrated embodiment, the electrical insulation between the first portion 101 and the second portion 102 is achieved by the second trench isolation layer 82. In the sense of the present invention, a "trench isolation layer" indicates that the respective isolation layer has been produced on or at a surface of a trench formed in the semiconductor body 100.

Figure 2C:
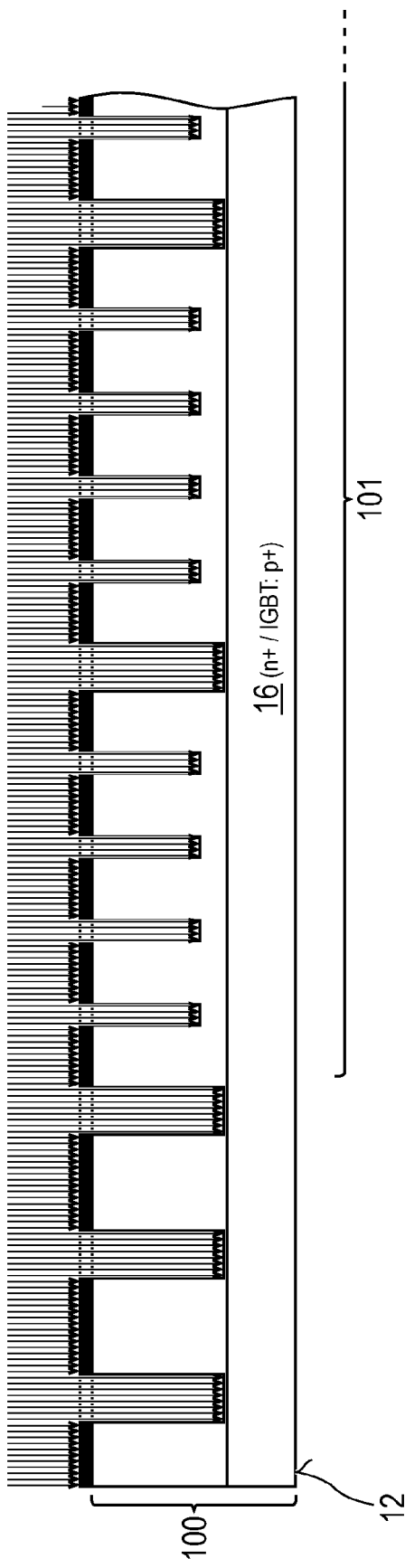
Figure 2D:
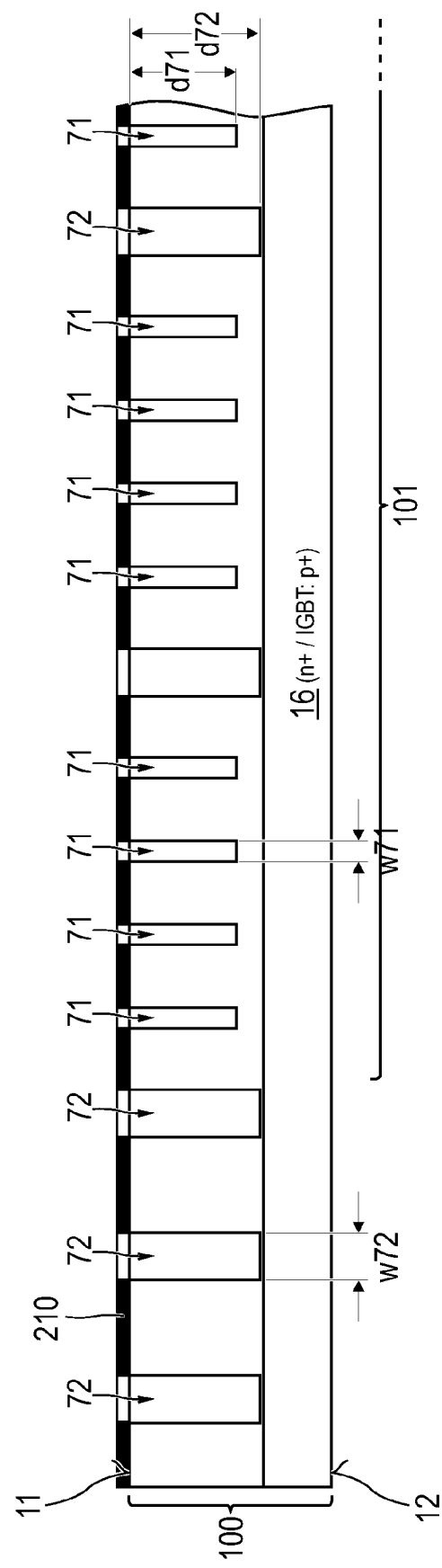

Referring now to FIGS. 2A to 2G, a method for producing the semiconductor component 1 of FIG. 1 will be explained. As illustrated in FIG. 2A, a semiconductor body 100 with a top side 11 and a bottom side 12 is provided. The top side 11 and the bottom side 12 are opposite sides of the semiconductor body 100. It is to be noted that during the production of the semiconductor component 1, top and/or bottom layers of the semiconductor body 100 may be removed so that the semiconductor body 100 has 'new' top sides and bottom sides, respectively. Nevertheless, the respective top and bottom sides of the semiconductor body 100 are designated with '11' and '12', respectively, throughout the following description.

As illustrated in FIG. 2A, a semiconductor body 100 is provided. The semiconductor body 100 may have a weakly doped semiconductor layer 15, for instance of the first conduction type (here: 'n'), that may be epitaxially grown on a substrate (here: a heavily doped layer 16). However, the heavily doped layer 16 may be produced at a later stage. In such cases, the provided semiconductor body 100 may have, for instance, a homogeneous doping of the first conduction type. As can be seen from FIG. 2B, a structured mask layer 210, for instance a hard mask layer like an oxide, having openings 211 and 212 is produced on the top side 11. As in FIG. 2C schematically illustrated by arrows, the mask layer 210 is used for anisotropically etching trenches into the semiconductor body 100. A suitable etching method is, for instance, RIE (RIE=reactive ion etching).

It is to be noted that the mask 210 has first openings 211, and second openings 212 wider than the first openings 211 so as to achieve first trenches 71 having a width w71 smaller than a width w72 of the second trenches 72. In a uniform etching process, the achieved depth of a trench increases with its width. Hence, the completed wide trenches 72 have, relative to the top side 11, a depth d72 higher than a depth d71 of the narrow trenches d71, see FIG. 2D. Directly after the production of the first and second trenches 71, 72 is completed, the ratio between the second depth d72 and the first depth d71 may be, for instance, in a range from 1.10 to 5.

In subsequent conventional process steps known in the art, transistor cells 30 are produced at least in the first portion 101. The result is illustrated in FIG. 2E. For producing the transistor cells 30, the first trench isolation layer 81 may be produced, for instance by (e.g., thermally) oxidizing a surface layer of the semiconductor body 100 at least along the surfaces of the first trenches 71, and/or by depositing a dielectric at least on the surfaces of the first trenches 71. In this connection it is to be noted that the first trench isolation layer 81 may optionally be produced using any two or more subsequent steps. That is, the first trench isolation layer 81 may be composed of two or more (different or identical) dielectrics produced in two or more subsequent steps.

At the surfaces of the second trenches 72, the second trench isolation layer 82 may be produced in one of the same manners as the first trench isolation layer 81 at the surfaces of the first trenches 71. In particular, the first trench isolation layer 81 and the second trench isolation layer 82 may partially or completely be produced simultaneously, for instance in a common oxidation and/or deposition step.

Then, the further elements of the arrangement of FIG. 1 arranged above the level of the top side 11, in particular the second contact terminal 22, are produced using conventional process steps known in the art. The result is illustrated in FIG. 2F.

In order to produce the first portion 101 and the second portion 102 (see FIG. 1) electrically insulated from the first portion 101, a bottom layer 20 of the semiconductor body 100 will be removed. The bottom layer 20 has a thickness t20 of at least the distance d1 between the bottom side 12 and the second trench isolation layer 82. This ensures that the complete bottom layer of the semiconductor body 100 between the bottom side 12 and the second trench isolation layer 82 is removed.

Removing the bottom layer 20 may be stopped instantly or delayed if a removal also of material of the second trench isolation layer 82 is detected. For removing the bottom layer 20, any conventional technique or any combination of conventional technique may be used, for instance grinding, polishing (e.g., CMP=chemical mechanical polishing), etching, etc. Monitoring the removed material allows for detecting the removal of parts of the second trench isolation layer 82 so that removing a bottom layer 20 can be stopped instantly or with a pre-defined delay so that the electrical separation between the first portion 101 and the second portion 102 (see FIG. 1) is guaranteed. It is also possible to completely remove the bottom layer of the second trench isolation layer 82. In such cases, an electrical insulation—if required—may be achieved by a third dielectric layer 93, as will be described below with reference to FIG. 3A.

For instance, the second contact terminal 22 may have a maximum thickness t22 of, for instance, at least 40 μm. FIG. 2G illustrates the arrangement after the removal of the bottom layer 20 is completed. It is to be noted that together with the removal of the bottom layer 20 of the semiconductor body 100, all other parts that are—prior to the removal of the bottom layer 20—arranged at a distance of less than or equal to t22 from the bottom side 12. It is also to be noted that the removal of the bottom layer 20 the removal of all other parts—if any—may take place over the complete lateral extension the semiconductor component 1 has at that manufacturing stage.

In the present example, for instance, the bottom layer of the second trench isolation layer 82 may be partly removed. After the removal of the bottom layer 20 is completed, the bottom side 12 is may be (apart from dishing effects) substantially planar.

Then, the further elements of the arrangement of FIG. 1 arranged underneath the level of the bottom side 12 are produced using conventional process steps known in the art. The result is illustrated in FIG. 1.

Referring now to FIG. 3A, there is illustrated a further semiconductor component 1 having a connection line 59 electrically connecting structures arranged at or on opposite sides of a semiconductor body 100 of the semiconductor component 1. Again, the semiconductor component 1 includes a transistor having a cell structure with a plurality of transistor cells 30. The transistor cells 30 are arranged in a first portion 101 of the semiconductor body 100 and electrically connected in parallel. The construction of the transistor cells 30 with the drain zone 16, the drift zone 15, the body zones 14, the heavily doped source zones 13, the structured first dielectric layer 91, the second dielectric layer 92, the third dielectric layer 93, the first trench isolation layer 81, the gate electrodes 53, the gate connection line 55, the vias 54, the first contact terminal 21, the second contact terminal 22, the gate contact terminal 23, and the optional field electrodes 52 and respective electrical connections thereof to the second contact terminal 22 may be the same as already described above with reference to FIG. 1.

Different from the semiconductor component 1 of FIG. 1, the electrical connection between the gate connection line 55 and the gate contact terminal 23 is not realized with a material that is part of the provided, untreated semiconductor body 100 but with an electrically conductive material that is filled into one of the wide trenches 72 formed in the semiconductor body 100. The electrically conductive material forms (at least) the above-explained connection line 59. For instance, the electrically conductive material may be a doped or undoped polycrystalline semiconductor material, e.g., polycrystalline silicon.

Optionally, the semiconductor regions 15' and/or 15" adjacent to the dielectric 82 arranged between semiconductor region 15' and the connection line 59 and between the semiconductor region 15" and the connection line 59, respectively, may also be used as connection line electrically connecting the gate connection line 55 and the gate contact terminal 23. Of course, in such cases, the layouts of the first and third dielectric layers 91, 93 must be appropriately adapted.

In the semiconductor component 1 of FIG. 3A, there is also at least one portion 102 of the semiconductor body 100 that is electrically insulated by the second trench isolation layer 82 from the first portion 101.

In a corresponding manner, a connection line that has been electrically insulated from the first portion according to the connection line 59 or according to a portion 102 or 103 or 104 of the semiconductor body 100 may be used for conducting an arbitrary electrical potential through the semiconductor body 100 either from the top side 11 to the bottom side 12 or from the bottom side 12 to the top side 11. For instance, such an electrical potential may be the source-potential, or an electric potential of a temperature sensor monolithically integrated in the semiconductor body 100. If required, one or more contact terminals may provided on the top and/or bottom side 11, 12 and electrically connected to the respective connection line.

FIG. 3B is a cross-sectional view of the semiconductor component 1 of FIG. 3A in a cross-sectional plane A-A running through the connection line 59 and through a longish transistor cell 30 having a gate electrode 53 and, underneath, a field electrode 52. In FIG. 3B, the line B-B indicates the cross-sectional plane of the view of FIG. 3A. Further, FIG. 3C is a horizontal cross-sectional view of the semiconductor component 1 of FIGS. 3A and 3B in a cross-sectional plane C-C (see FIG. 3B) running through the connection line 59 and one of the gate electrodes 53. As can be seen from FIGS. 3B and 3C, the connection line 59 may be an integral part of a gate electrode 53.

Next, a possible method for producing a semiconductor component 1 as described with reference to FIGS. 3A to 3C will now be explained with reference to FIGS. 4A to 4R.

According to FIG. 4A, a semiconductor body 100 is provided. The semiconductor body 100 may have the same properties as the semiconductor body 100 described above with reference to FIG. 2A.

On the top side 11, a structured mask layer 210 having at least one narrow opening 211 and at least one wide opening 212 is produced on the top side 11 as illustrated in FIG. 4B and the corresponding top view of FIG. 4C.

As in FIG. 4D schematically illustrated by arrows, the mask layer 210 is used for anisotropically etching at least one narrow trench 71 and at least one wide trench 72 into the semiconductor body 100. A suitable etching method is, for instance, RIE. The completed trenches 71 and 72 are illustrated in the top view of FIG. 4E and the cross-sectional view of FIG. 4F. The narrow trenches 71 have a first width w71 and the wide trenches 72 have a second width w72 greater than the first width w71. Again, the first and second trenches 71, 72 may optionally be produced simultaneously in a common etching step.

As already explained above, in a uniform etching process, the achieved depth of a trench increases with its width. Hence, the completed wide trenches 72 have, relative to the top side 11, a depth d72 higher than a depth d71 of the narrow trenches d71, see FIG. 4F. Directly after the production of the first and second trenches 71, 72 is completed, the ratio between the second depth d72 and the first depth d71 may be, for instance, in a range from 1.10 to 5. As illustrated in FIGS. 4E and 4F, a narrow trench 71 and a wide trench 72 may blend into each other and form a common trench with varying width and depth.

In subsequent conventional process steps known in the art, the optional field electrodes 52 and the gate electrodes 53 are produced at least in the narrow trenches 71. For this, a dielectric layer 83 may be produced, for instance by (e.g. thermally) oxidizing a surface layer of the semiconductor body 100 at least along the surfaces of the first and second trenches 71, 72, and/or by depositing a dielectric material 83, e.g. conformally, at least on the surfaces of the first and second trenches 71, 72. The result is depicted in FIG. 4G.

Subsequently, an electrically conductive material 52' is filled into the first and second trenches 71, 72, see FIG. 4H. At a later stage, a remainder of the electrically conductive material 52' forms the field electrodes 52. The used electrically conductive material may be the same as the material used for the field electrodes 52 of FIG. 1. Optionally, the first and second trenches 71, 72 may be overfilled with the material 52' and subsequently planarized, see FIG. 4J.

In a further anisotropic etching step, in FIG. 4K again schematically illustrated by arrows, the mask layer 210 or a further mask layer is used for anisotropically etching and thereby partly removing the electrically conductive material 52'. A suitable etching method is, for instance, RIE. In the region of the (now filled) narrow trenches 71, the electrically conductive material 52' has a smaller width than in the region of the (now filled) wide trenches 72. Hence, as already explained above, in the region of the wide trenches 72, the electrically conductive material 52' is etched away to a greater depth than in the region of the narrow trenches as can be seen in FIG. 4L.

As further illustrated in FIG. 4L, the process may be adjusted such that the electrically conductive material 52' is completely removed in the region of the wide trenches 72 and only in part in the region of the narrow trenches 71.

Subsequently, a further dielectric layer 84 may be produced at least on the remainder of the electrically conductive material 52', for instance by thermally oxidizing the electrically conductive material 52. The result is illustrated in FIG. 4M.

Then, a further electrically conductive material 53' is filled into the first and second trenches 71, 72 and subsequently planarized, see FIG. 4N. At a later stage, the remainder of the electrically conductive material 53' forms the gate electrodes 53 and the connection line 59. The used electrically conductive material may be the same as the material used for the gate electrodes 53 of FIG. 1. Sections 81' and 81" of the dielectrics 83 and 84, respectively, together form the first trench isolation layer 81 illustrated in FIG. 3A.

Figure 4P:
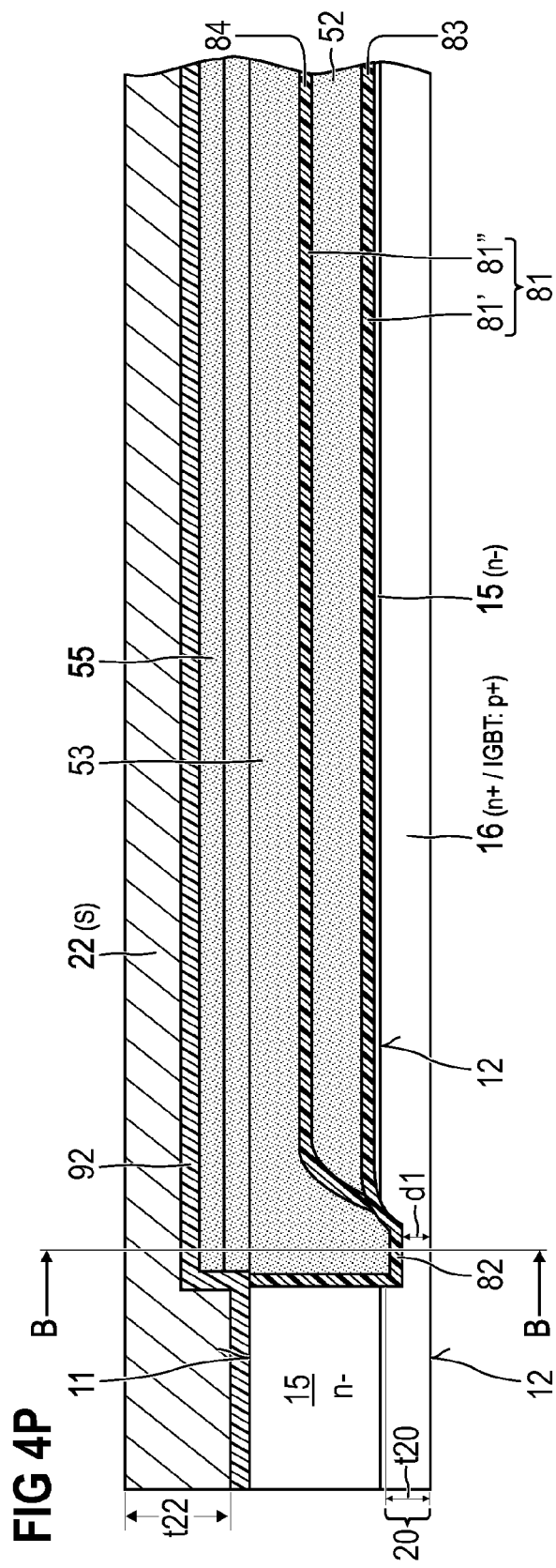

Then, the further elements of the arrangement of FIG. 3A arranged above the level of the top side 11, in particular the second contact terminal 22, are produced using conventional process steps known in the art. The result is illustrated in FIG. 4P.

In order to produce the first portion 101 and the second portion 102 (see FIG. 3A) electrically insulated from the first portion 101, a bottom layer 20 of the semiconductor body 100 will be removed in the same manner as described with reference to FIGS. 2F and 2G. Again, the bottom layer 20 has a thickness t20 of at least the distance d1 between the bottom side 12 and the second trench isolation layer 82. This ensures that the complete bottom layer of the semiconductor body 100 between the bottom side 12 and the second trench isolation layer 82 is removed. The result is illustrated in FIG. 4Q. Removing the bottom layer 20 is carried out such that the electrically conductive material 53 is exposed at the bottom side 12 and can be electrically contacted.

As already explained above with reference to FIGS. 2F and 2G, in particular the existence of the second contact terminal 22 (which here exemplarily is a source contact terminal) on the top side 11 ensures sufficient stability of the arrangement during the removal of the bottom layer 20. Again, the second contact terminal 22 may have a (compared to conventional contact terminals) an increased maximum thickness t22 of, for instance, at least 40 µm. FIG. 4Q illustrates the arrangement after the removal of the bottom layer 20 is completed.

Then, the further elements of the arrangement of FIGS. 3A and 3B arranged underneath the level of the bottom side 12 are produced using conventional process steps known in the art. The result is illustrated in FIGS. 4R and 3C. As illustrated, the gate contact terminal 23 may directly contact the electrically conductive material 53' where it is exposed at the bottom side 12 (see also FIG. 4Q).

As exemplarily illustrated in the semiconductor components of FIGS. 1 and 3A, further deep and filled trenches may be used as support points SP for removing bottom layers of the semiconductor body 100, for instance like the above-described bottom layers 20, in order to reduce or avoid dishing effects that can occur by grinding and/or polishing (e.g. CMP).

Figure 7:
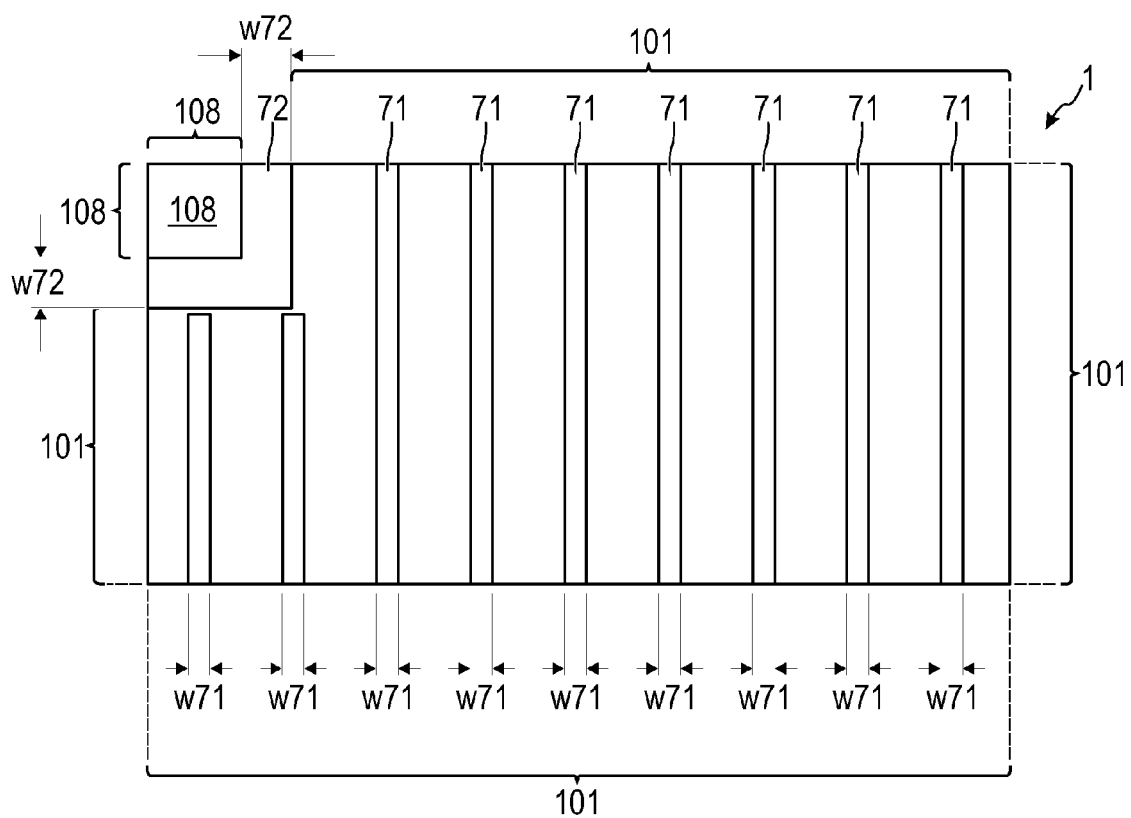

Referring now to FIGS. 5 to 7, there are illustrated top views of further examples of (uncompleted) semiconductor components 1 in which a first portion 101 of a semiconductor body 100 is separated and electrically insulated from other portions 105, 106 (FIG. 5), 107 (FIG. 6) and 108 (FIG. 7) by producing wide and deep second trenches 72 having both widths w72 greater than the widths w71 of first trenches 71 and depths greater than the depths of the first trenches 71, and by producing dielectric layers at least at the side walls of the wide and deep second trenches 72 and optionally also at the bottoms of the wide and deep second trenches 72 in the same manner as the dielectrics 82 described in the embodiments above. Those dielectric layers serve to electrically insulate the first portion 101 from the portions 105, 106, 107 and 108, respectively.

In any case, the first trenches 71 arranged in the portion 101 may be used for producing transistor cells 30 as described in the embodiments above.

In the embodiment of FIG. 5, the first portion is arranged between the portions 105 and 106. Also the portions 105 and 106 are separated and electrically insulated from one another by the wide and deep second trenches 72.

As illustrated in the embodiment of FIG. 6, a wide and deep trench 72 may be ring-shaped so as to electrically insulate a first portion 101 arranged inside the ring from a portion 107 outside the ring. In the same manner, two (or more) wide and deep ring-shaped trenches 72 may be nested into each other with a further portion of the semiconductor body 100 arranged between the wide and deep ring-shaped trenches 72.

Then, according to FIG. 7, a portion 108 arranged in a corner of the semiconductor body 100 is separated and electrically insulated from a first portion 101 by a wide and deep second trench 72.

Figure 8:
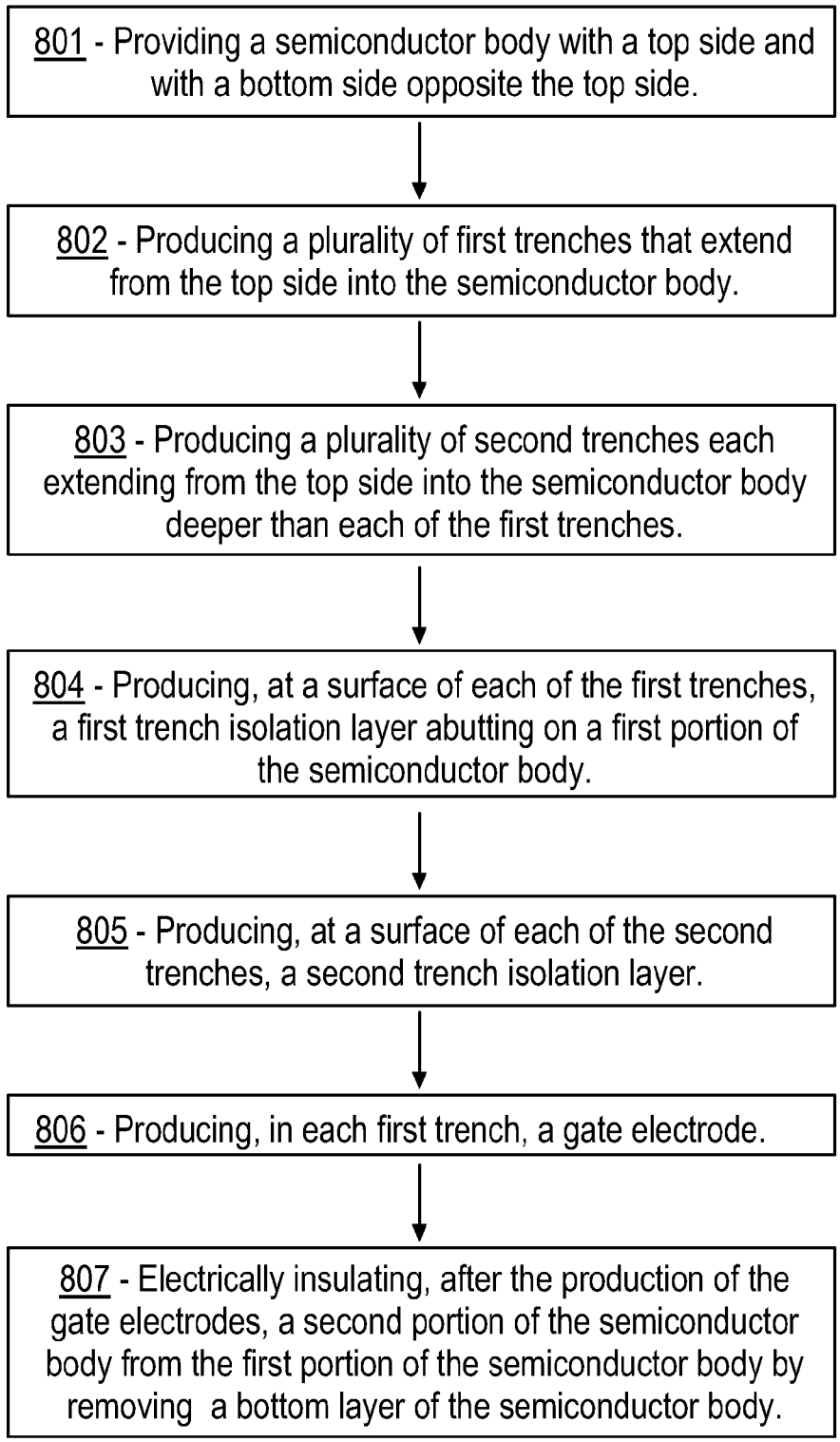
FIG. 8 illustrates a method for producing a semiconductor component having a connection line electrically connecting structures arranged at or on opposite sides of a semiconductor body of the semiconductor component.

Finally, FIG. 8 illustrates significant steps of a method for producing a semiconductor component having a connection line electrically connecting structures arranged at or on opposite sides of a semiconductor body of the semiconductor component. The method includes; providing a semiconductor body with a top side and with a bottom side opposite the top side (801); producing a plurality of first trenches that extend from the top side into the semiconductor body (802); producing a plurality of second trenches each extending from the top side into the semiconductor body deeper than each of the first trenches (803); producing, at a surface of each of the first trenches, a first trench isolation layer abutting on a first portion of the semiconductor body (804); producing, at a surface of each of the second trenches, a second trench isolation layer (805); producing, in each of the first trenches, a gate electrode (806); and electrically insulating, after the production of the gate electrodes, a second portion of the semiconductor body from the first portion of the semiconductor body by removing a bottom layer of the semiconductor body (807).

In the above description, the invention has been described by way of example for semiconductor components in which the first conduction type was 'n' and the second conduction type was 'p'. However, the invention also covers complementary semiconductor components in which the first conduction type is 'p' and the second conduction type is 'n'.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents. In particular, the features/method steps of different embodiments may be combined in an arbitrary manner unless the combination of certain features/method steps is technically impossible.

What is claimed is:

1. A method for producing a semiconductor component comprising a transistor having a cell structure with a number of transistor cells monolithically integrated in a semiconductor body and electrically connected in parallel, the method comprising:
   providing a semiconductor body with a top side and with a bottom side opposite the top side;
   producing a plurality of first trenches that extend from the top side into the semiconductor body;
   producing a plurality of second trenches, each extending from the top side into the semiconductor body deeper than each of the first trenches;
   producing, at a surface of each of the first trenches, a first trench isolation layer abutting on a first portion of the semiconductor body;
   producing, at a surface of each of the second trenches, a second trench isolation layer;
   producing, in each of the first trenches, a gate electrode; and
   electrically insulating, after the production of the gate electrodes, a second portion of the semiconductor body from the first portion of the semiconductor body by removing a bottom layer of the semiconductor body.

2. The method as claimed in claim 1, wherein the bottom layer to be removed has a thickness of at least a distance between the bottom side and the second trench isolation layer.

3. The method as claimed in claim 1, wherein each of the second trenches has a width greater than a width of each of the first trenches.

4. The method as claimed in claim 1, wherein the first trenches and the second trenches are produced simultaneously in a common etching step.

5. The method as claimed in claim 1, further comprising producing, on the top side, a gate connection line that is electrically insulated from the first portion of the semiconductor body and that electrically interconnects the gate electrodes.

6. The method as claimed in claim 5, wherein the gate connection line comprises at least one of:
   polycrystalline semiconductor material doped with electrically active dopants;
   polycrystalline semiconductor material doped with electrically active dopants and silicidized; and
   metal.

7. The method as claimed in claim 5, wherein the gate connection line is electrically connected to the second portion of the semiconductor body.

8. The method as claimed in claim 7, further comprising producing, on the bottom side, a gate contact terminal that is electrically connected to the second portion of the semiconductor body such that the gate contact terminal is electrically connected to the gate electrodes via the second portion of the semiconductor body and the gate connection line.

9. The method as claimed in claim 1, wherein:
   producing the gate electrode in each of the first trenches comprises, in a common deposition step, depositing an electrically conductive material in both the first trenches and the second trenches;
   removing the bottom layer of the semiconductor body is carried out such that the electrically conductive material is exposed at the bottom side.

10. The method as claimed in claim 9, wherein each of the second trenches blends into one of the first trenches.

11. The method as claimed in claim 9, wherein the electrically conductive material comprises polycrystalline semiconductor material that is doped with electrically active dopants, or undoped.

12. The method as claimed in claim 11, further comprising: producing, on the bottom side, a gate contact terminal that is electrically connected to the electrically conductive material.

13. The method as claimed in claim 11, further comprising: producing, on the bottom side, a gate contact terminal directly contacting the electrically conductive material where it is exposed.

14. The method as claimed in claim 1, further comprising: providing a first contact terminal on the bottom side; and providing a second contact terminal on the top side.

15. The method as claimed in claim 1, further comprising: providing a second contact terminal on the top side prior to removing a bottom layer of the semiconductor body.

16. The method as claimed in claim 14, wherein the first contact terminal is a drain contact terminal and the second contact terminal is a source contact terminal.

17. The method as claimed in claim 14, wherein providing the second contact terminal on the top side is carried out prior to removing the bottom layer of the semiconductor body.

18. The method as claimed in claim 1, wherein removing the bottom layer of the semiconductor body is carried out with chemical mechanical polishing.

19. The method as claimed in claim 1, wherein, in each of the first trenches, the first trench isolation layer is arranged at a side wall and at the bottom of the respective first trench.

20. The method as claimed in claim 1, wherein, for producing the first trench isolation layer at a surface of each of the first trenches, in each of the first trenches a surface layer of the semiconductor body is oxidized.

21. The method as claimed in claim 1, wherein, for producing the first trench isolation layer at a surface of each of the first trenches, a dielectric material is deposited on the surfaces of the first trenches.

22. The method as claimed in claim 21, wherein the dielectric material is conformally deposited on the surfaces of the first trenches.

23. The method as claimed in claim 1, wherein first trench isolation layer and the second trench isolation layer are produced simultaneously by
    oxidizing a surface layer of the semiconductor body; or
    depositing a dielectric material on surfaces of the first trenches and on surfaces of the second trenches.

24. The method as claimed in claim 1, wherein removing the bottom layer of the semiconductor body is stopped instantly or delayed if a removal of the material of the second trench isolation layer is detected.

25. The method as claimed in claim 1, wherein, directly after the production of the first and second trenches is completed and prior to the production of the first and second dielectrics, one of the first trenches has a first depth and one of the second trenches has a second depth, and wherein the ratio between the second depth and the first depth is in a range from 1.10 to 5.

* * * * *

UNITED STATES PATENT AND TRADEMARK OFFICE
CERTIFICATE OF CORRECTION

PATENT NO.         : 9,123,559 B2                                    Page 1 of 1
APPLICATION NO.    : 13/906425
DATED              : September 1, 2015
INVENTOR(S)        : Meiser et al.

It is certified that error appears in the above-identified patent and that said Letters Patent is hereby corrected as shown below:

Title Page/Inventors (72) line 2, please change "Egmeting (DE)" to -- Egmating (DE) --

In the Claims

Column 13, line 8 (claim 23) please change "wherein first" to -- wherein the first --

Signed and Sealed this
Third Day of May, 2016

Michelle K. Lee
*Director of the United States Patent and Trademark Office*